(12) United States Patent
Tung et al.

(10) Patent No.: US 9,054,194 B2
(45) Date of Patent: Jun. 9, 2015

(54) NON-PLANAR TRANSISTORS AND METHODS OF FABRICATION THEREOF

(75) Inventors: Chih-Hang Tung, Hsin-Chu (TW);
Chin-Hsiang Lin, Hsin-Chu (TW);
Cheng-Hung Chang, Hsin-Chu (TW);
Sey-Ping Sun, Hsin-Chu (TW)

(73) Assignee: Taiwan Semiconductor Manufactruing Company, Ltd., Hsin-Chu (TW)

( * ) Notice: Subject to any disclaimer, the term of this patent is extended or adjusted under 35 U.S.C. 154(b) by 1020 days.

(21) Appl. No.: 12/652,947

(22) Filed: Jan. 6, 2010

(65) Prior Publication Data

US 2010/0276761 A1 Nov. 4, 2010

Related U.S. Application Data

(60) Provisional application No. 61/173,809, filed on Apr. 29, 2009.

(51) Int. Cl.
| | |
|---|---|
| *H01L 21/336* | (2006.01) |
| *H01L 29/78* | (2006.01) |
| *H01L 29/417* | (2006.01) |
| *H01L 29/66* | (2006.01) |

(52) U.S. Cl.
CPC ...... *H01L 29/7856* (2013.01); *H01L 29/41791* (2013.01); *H01L 29/66803* (2013.01); *H01L 29/7839* (2013.01); *H01L 29/785* (2013.01); *H01L 2029/7858* (2013.01)

(58) Field of Classification Search
CPC ............ H01L 29/41791; H01L 29/66803; H01L 29/785; H01L 29/7858; H01L 29/7856; H01L 29/7839; H01L 2029/7858
USPC ..................... 257/382, 384, E21.41
See application file for complete search history.

(56) References Cited

U.S. PATENT DOCUMENTS

| | | | |
|---|---|---|---|
| 5,578,513 | A | 11/1996 | Maegawa |
| 5,705,405 | A | 1/1998 | Cunningham |
| 6,521,515 | B1 | 2/2003 | Kluth |

(Continued)

FOREIGN PATENT DOCUMENTS

| | | |
|---|---|---|
| CN | 1471139 A | 1/2004 |
| CN | 1783514 A | 6/2006 |

(Continued)

OTHER PUBLICATIONS

Kwok K. Ng, Complete Guide to Semiconductor Devices, 685-87 (2d ed. 2002).*

(Continued)

*Primary Examiner* — Laura Menz
*Assistant Examiner* — Candice Y Chan
(74) *Attorney, Agent, or Firm* — Slater & Matsil, L.L.P.

(57) ABSTRACT

Non-planar transistors and methods of fabrication thereof are described. In an embodiment, a method of forming a non-planar transistor includes forming a channel region on a first portion of a semiconductor fin, the semiconductor fin having a top surface and sidewalls. A gate electrode is formed over the channel region of the semiconductor fin, and an in-situ doped semiconductor layer is grown on the top surface and the sidewalls of the semiconductor fin on opposing sides of the gate electrode using a selective epitaxial growth process. At least a part of the doped semiconductor layer is converted to form a dopant rich region.

20 Claims, 31 Drawing Sheets

(56) References Cited

U.S. PATENT DOCUMENTS

| | | |
|---|---|---|
| 6,706,571 B1 | 3/2004 | Yu et al. |
| 6,744,103 B2 | 6/2004 | Snyder |
| 6,858,478 B2 | 2/2005 | Chau et al. |
| 6,933,183 B2 | 8/2005 | Beintner et al. |
| 7,190,050 B2 | 3/2007 | King et al. |
| 7,247,887 B2 | 7/2007 | King et al. |
| 7,265,008 B2 | 9/2007 | King et al. |
| 7,358,121 B2 | 4/2008 | Chau et al. |
| 7,405,449 B2 * | 7/2008 | Yagishita .................. 257/382 |
| 7,508,031 B2 | 3/2009 | Liu et al. |
| 7,528,465 B2 | 5/2009 | King et al. |
| 7,605,449 B2 | 10/2009 | Liu et al. |
| 2005/0153490 A1 | 7/2005 | Yoon et al. |
| 2005/0287730 A1 | 12/2005 | Snyder et al. |
| 2006/0091490 A1 | 5/2006 | Chen et al. |
| 2007/0001223 A1 | 1/2007 | Boyd et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0141836 A1 | 6/2007 | Yamauchi et al. |
| 2007/0215956 A1 | 9/2007 | Tsuchiya et al. |
| 2008/0111163 A1 | 5/2008 | Russ et al. |
| 2008/0290470 A1 | 11/2008 | King et al. |
| 2008/0296632 A1 | 12/2008 | Moroz et al. |
| 2008/0296702 A1 | 12/2008 | Lee et al. |
| 2009/0020819 A1 * | 1/2009 | Anderson et al. ............. 257/365 |
| 2009/0181477 A1 | 7/2009 | King et al. |

FOREIGN PATENT DOCUMENTS

| | | |
|---|---|---|
| CN | 1822338 A | 8/2006 |
| CN | 101315933 A | 12/2008 |

OTHER PUBLICATIONS

Lee, R. T-K., et al., "Achieving Conduction Band-Edge Schottky Barrier Height for Arsenic-Segregated Nickel Aluminide Disilicide and Implementation in FinFETs With Ultra-Narrow Fin Widths," IEEE Electron Device Letters, vol. 29, No. 4, Apr. 2008, pp. 382-385.

Zhang, M., et al., "Schottky barrier height modulation using dopant segregation in Schottky-barrier SOI-MOSFETs," Proceedings of ESSDERC, Grenoble, France, 2005, pp. 457-460.

* cited by examiner

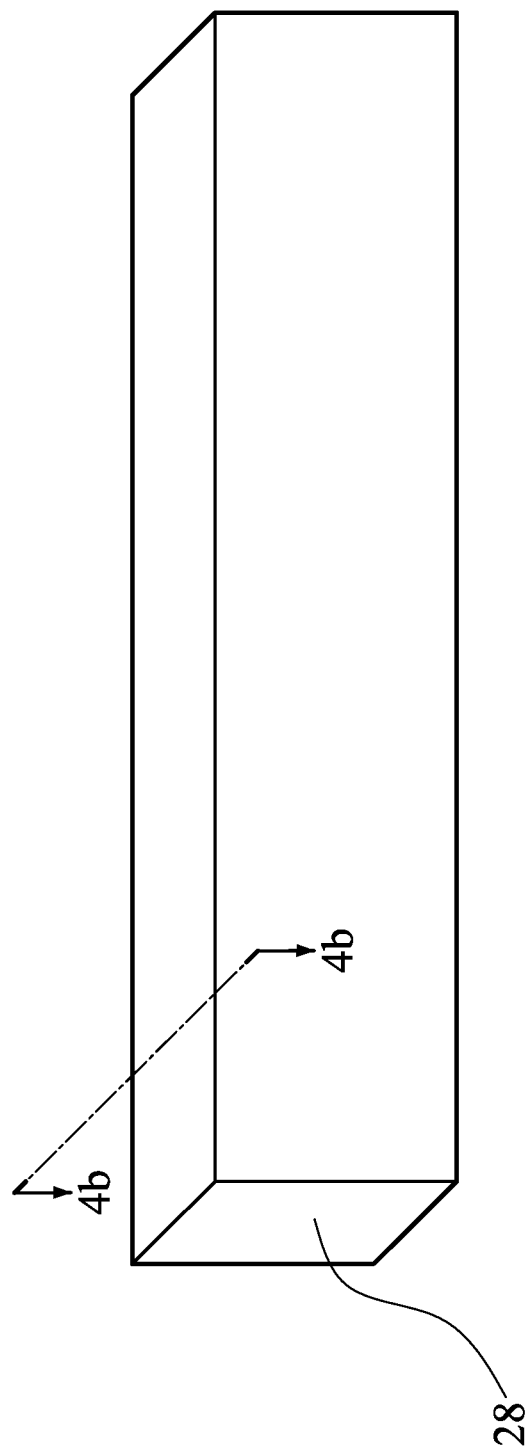

NON-PLANAR TRANSISTORS AND METHODS OF FABRICATION THEREOF

This application claims the benefit of U.S. Provisional Application No. 61/173,809, entitled "Non-Planar Transistors and Methods of Fabrication Thereof", filed on Apr. 29, 2009, which is incorporated herein by reference.

TECHNICAL FIELD

The present invention relates generally to transistors and, more particularly, to non-planar transistors and methods of fabrication thereof.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs), such as metal oxide semiconductor (MOS) transistors.

One of the goals of the semiconductor industry is to continue shrinking the size and increasing the speed of individual FETs. To achieve these goals, three dimensional (3-D) or non-planar transistor structures such as fin FETs (FINFETs), multiple gate transistors, or gate all around transistors are being investigated for use in sub 22 nm transistor nodes. Such transistors not only improve areal density, but also improve gate control of the channel.

However, fabrication of these non-planar FETs is complex and requires overcoming a number of challenging problems. One of the challenges is forming metal semiconductor contacts with low contact resistance. As at least one of the source or the drain contacts is composed partially or fully of a metal silicide, the Schottky barrier height between the source/drain region and the metal silicide needs to be reduced. A method of reducing the Schottky barrier height involves increasing the doping level of the surface of the semiconductor being contacted. Traditional methods of doping the semiconductor involve implanting dopants into the surface of the semiconductor during or after source/drain implantation. Unlike planar structures, however, such implantation into non-planar structures does not produce uniform surface or near surface concentrations. Further, in non-planar structures, implantation leaves residual defects that may result in poor silicide formation or result in leakage currents.

Accordingly, what is needed in the art are structures and methods of fabrication thereof with low resistance contacts for non-planar semiconductor structures.

SUMMARY OF THE INVENTION

These and other problems are generally solved or circumvented, and technical advantages are generally achieved, by preferred embodiments of the present invention.

Embodiments of the invention include non-planar transistors and methods of fabrication thereof. In accordance with an embodiment of the present invention, a method of forming a non-planar transistor includes forming a channel region on a first portion of a semiconductor fin, the semiconductor fin comprising a top surface and sidewalls, and forming a gate electrode over the channel region of the semiconductor fin. The method further comprises growing an in-situ doped semiconductor layer on the top surface and the sidewalls of the semiconductor fin on opposing sides of the gate electrode using a selective epitaxial growth process. At least a part of the doped semiconductor layer is converted into a dopant rich region.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1d, illustrates a non-planar Schottky source/drain transistor in accordance with an embodiment of the invention, wherein FIG. 1a illustrates a top view, and wherein FIGS. 1b-1d illustrate cross sectional views;

FIG. 2, which includes FIGS. 2a-2d, illustrates a non-planar transistor in accordance with an embodiment of the invention, wherein FIG. 2a illustrates a top view, and wherein FIGS. 2b-2d illustrate cross sectional views;

FIG. 3, which includes FIGS. 3a-3d, illustrates a gate all around transistor in accordance with an embodiment of the invention, wherein FIG. 3a illustrates a top view, and wherein FIGS. 3b-3d illustrate cross sectional views;

FIG. 4, which includes FIGS. 4a-4e, illustrate various stages of fabrication of a non-planar structure in accordance with embodiments of the invention, wherein FIG. 4a illustrates a perspective view of a fin (non-planar structure), and FIGS. 4b-4e illustrate cross sectional views of the fin;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a non-planar field effect transistor. The invention may also be applied, however, to other devices and structures. As discussed in greater detail below, various embodiments of the present invention overcome the limitations discussed above by using an epitaxial process. The use of epitaxial process prevents nucleation of residual defects. Further, a uniformly controlled doping is achievable even in non-planar structures.

A structural embodiment of a non-planar transistor with low Schottky barrier height will be described with reference to FIG. 1. Further structural embodiments are described below with respect to FIGS. 2 and 3. A method of reducing the Schottky barrier height between the metal contact and a non-planar semiconductor structure will be described with reference to FIG. 4. A method of forming non-planar transistors will be described with reference to FIGS. 5-11 in accordance with an embodiment of the invention. Alternative embodiments of fabrication will be described with reference to FIG. 12, and FIGS. 13-16.

Figure 1A:
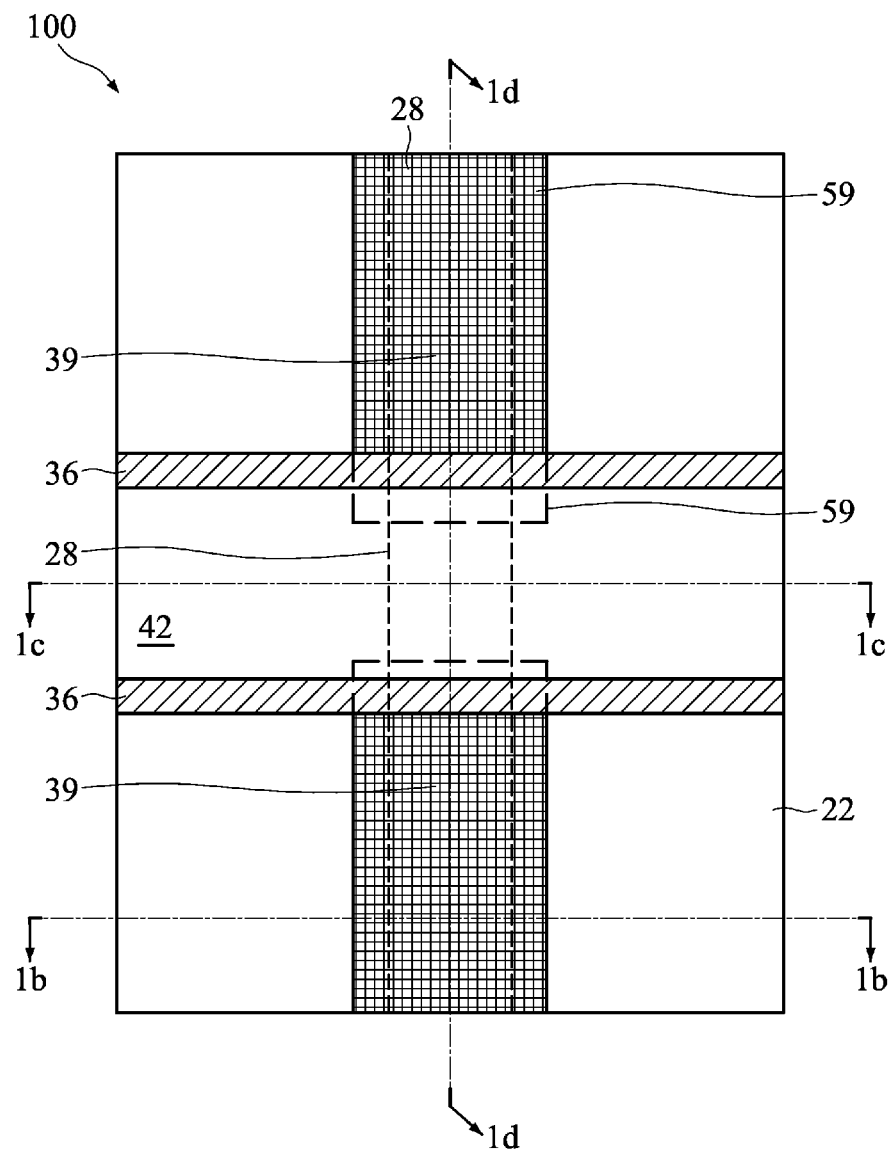
Figure 1B:
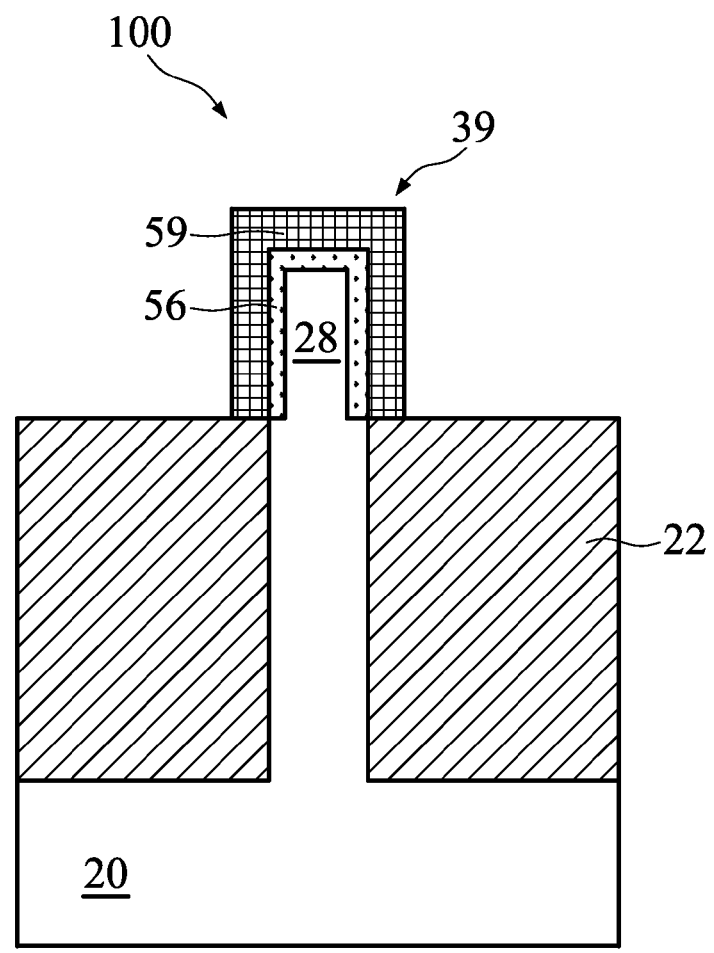
Figure 1C:
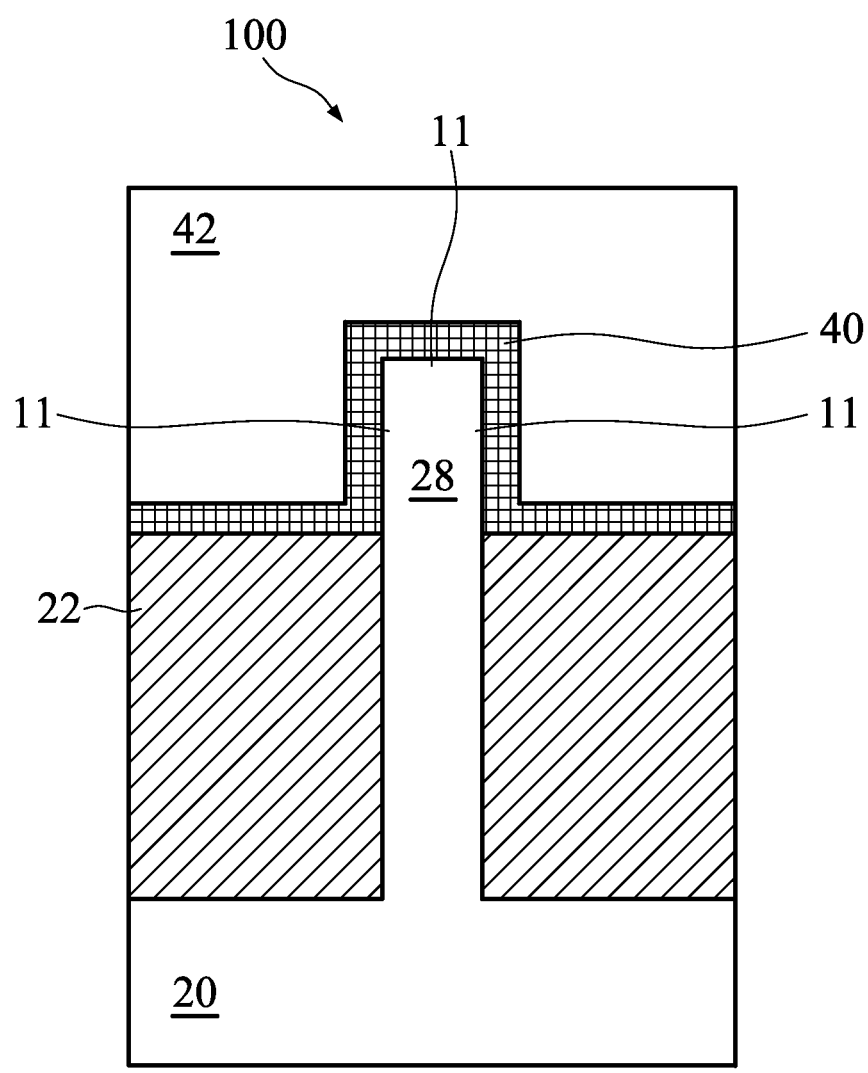
Figure 1D:
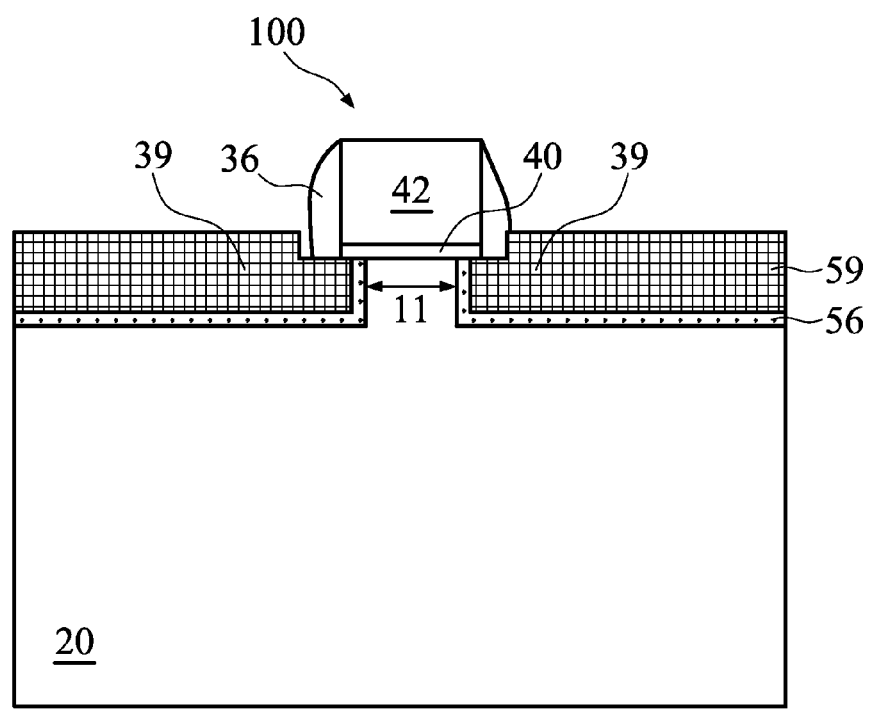

FIG. 1, which includes FIGS. 1a-1d, illustrates a non-planar transistor in accordance with an embodiment of the invention. FIG. 1a illustrates a top view, whereas FIGS. 1b-1d illustrate cross sectional views taken along the respective lines of FIG. 1a.

Referring to FIG. 1a, a transistor 100 includes a fin 28 separated by isolation regions 22. A gate electrode 42 is disposed over the fin 28. The fin 28 is covered with a metal silicide layer 59, which is disposed on either side of the gate electrode 42, and may be disposed under the spacers 36 and/or gate electrode 42 in some embodiments. FIG. 1a also illustrates the source/drain regions 39 of the transistor 100. A contact (not shown) is disposed on the metal silicide layer 59.

FIG. 1b illustrates a cross sectional view of the transistor 100 taken along the line 1b-1b of FIG. 1a. The fin 28, disposed between the isolation regions 22, is a continuous piece of underlying semiconductor substrate 20. In some embodiments, the fin 28 may be separated from the substrate 20 by an insulation layer (not shown). The fin 28 is covered by a dopant rich region 56, and the metal silicide layer 59 is disposed over the dopant rich region 56. In various embodiments, the metal silicide layer 59 is separated from the fin 28 by the dopant rich region 56 of about a constant thickness. In various embodiments, the thickness of the dopant rich region 56 is about 0.5 nm to about 10 nm.

Referring to the cross sectional view of FIG. 1c (which is taken along the line 1c-1c of FIG. 1a), the gate electrode layer 42 is disposed over a gate dielectric 40. If the thickness of the gate dielectric 40 is uniform on all the surfaces of the fin 28, a triple gate transistor is formed. The channel 11 of the triple gate transistor is disposed under the gate electrode 42 on a top surface and sidewalls of the fin 28. However, in some embodiments, an additional dielectric layer may be formed over a top surface of the fin 28 before or after forming the gate dielectric 40. Hence, the top surface of the fin 28 is separated from the gate electrode layer 42 by a thicker gate dielectric (gate dielectric 40 and the additional dielectric layer), while the sidewalls of the fin 28 are separated by the gate dielectric 40. Consequently, in such embodiments, the channel 11 of the transistor is formed only along the sidewalls of the fin 28, forming a double gate transistor.

FIG. 1d illustrates a cross section of the transistor 100 of the fin 28 along the direction of current flow in the channel and illustrates the source/drain regions 39 disposed within the fin 28 as indicated by the line 1d-1d in FIG. 1a. Unlike conventional transistors, the source/drain regions 39 comprise the metal silicide layer 59. In various embodiments, the thickness of the metal silicide layer 59 under the spacers 36 is less than about 20 nm, e.g., about 10 nm. In various embodiments, the metal silicide layer 59 extends under the gate electrode 42 and gate dielectric 40 by a small distance to minimize overlap resistance between the source/drain regions 39 and the channel 11 of the transistor 100. In various embodiments, the metal silicide layer 59 extends less than about 5 nm under the gate electrode 42. In some embodiments, only the dopant rich region 56 extends under the gate electrode 42. In various embodiments, the source/drain regions 39 adjacent the gate electrode 42 comprise a depth less than about 15 nm into the substrate 20.

In various embodiments, the metal silicide layer 59 has a Schottky barrier with the channel 11. The Schottky barrier height between the dopant rich region 56 and the metal silicide layer 59 determines the source/drain series resistance of the transistor. A low Schottky barrier height is required to reduce this series resistance, but also to prevent multiple turn on in sub-threshold operation. In various embodiments, the dopant rich region 56 is heavily doped so as to minimize this resistance.

In an embodiment, the dopant rich region 56 is doped to a concentration greater than about $1 \times 10^{18}$ cm$^{-3}$, and greater than about $5 \times 10^{19}$ cm$^{-3}$ in another embodiment. For example, if a NMOS transistor is being fabricated the dopant rich region 56 comprises an n-type dopant such as arsenic, antimony and/or phosphorus. Alternatively, if a PMOS transistor is being fabricated, the dopant rich region 56 comprises a p-type dopant such as boron and/or indium.

The metal silicide layer 59 comprises a suitable metal silicide to lower the Schottky barrier height of the majority carriers. For example, if the non-planar transistor comprises a PMOS transistor, the metal silicide layer 59 is selected to have a vacuum work function greater than about 4.6 eV, and greater than about 5.0 eV. In various embodiments, the metal silicide layer 59 for a PMOS transistor comprises nickel, platinum, palladium, and/or cobalt. In various embodiments, the Schottky barrier height for holes from the metal silicide layer 59 into the channel 11 is less than 0.2 eV for a PMOS transistor.

In contrast, if the non-planar transistor comprises a NMOS transistor, the metal silicide layer 59 is selected to have a vacuum work function less than about 4.6 eV, and less than about 4.0 eV. In various embodiments, the metal silicide layer 59 for a NMOS transistor comprises nickel, aluminum, and/or lanthanoids. In an embodiment, the metal silicide layer 59 for a NMOS transistor comprises nickel doped with lanthanoids such as La, Er, Y, Yb, Dy, Gd, Ce, Tb, Pr and/or Er. In an alternative embodiment, the metal silicide layer 59 for a NMOS transistor comprises a nickel aluminide disilicide (NiSi$_2$Al$_x$). In various embodiments, the Schottky barrier height for electrons from the metal silicide layer 59 into the channel 11 is less than 0.2 eV for a NMOS transistor.

In various embodiments, the low Schottky barrier height at the source of the transistor and the ultra-shallow junction depths (depth of source/drain regions 39) achievable with metal silicides significantly improving short channel effects of the transistor, a serious limitation in scaling traditional transistors.

Figure 2A:
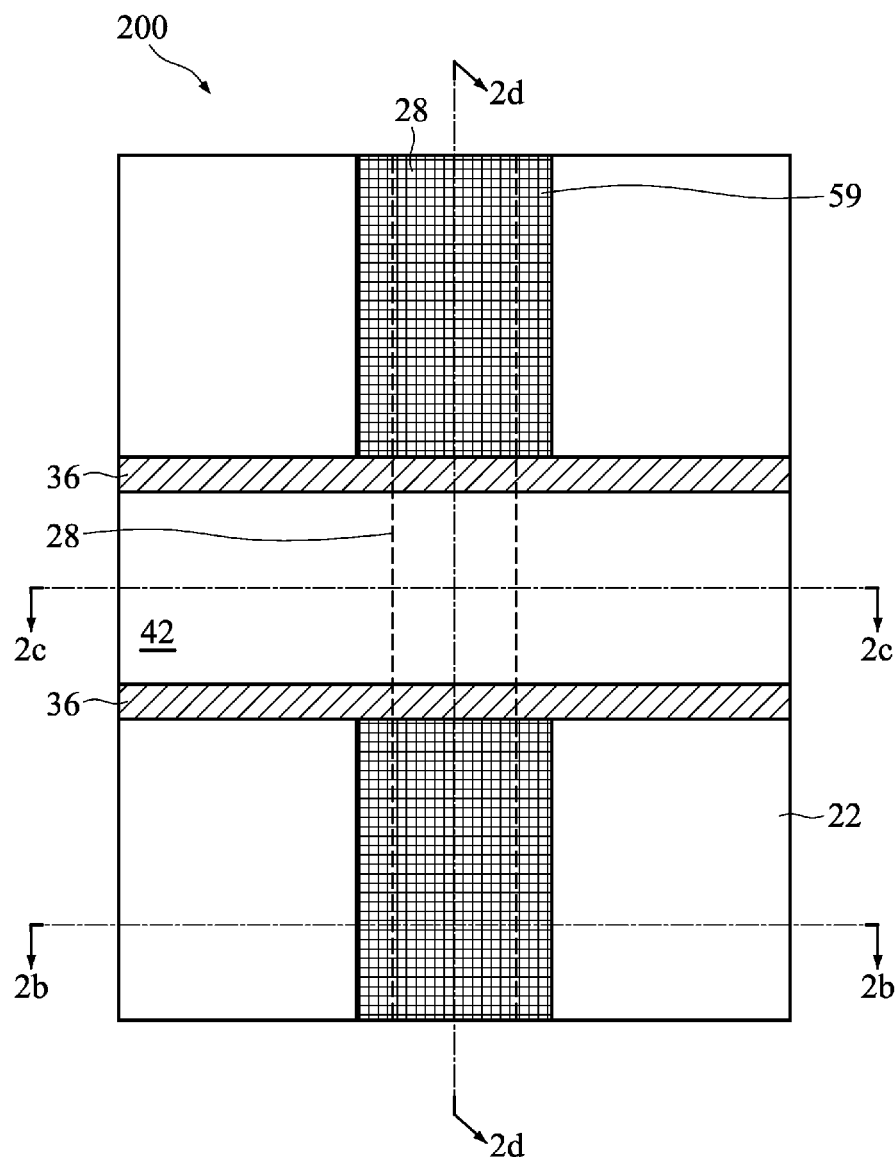
Figure 2B:
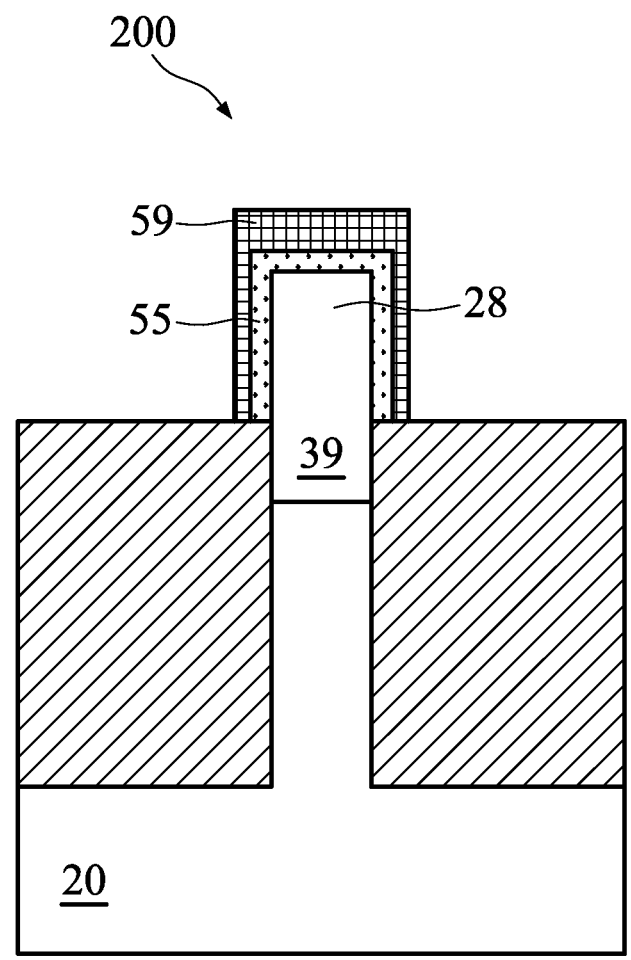
Figure 2C:
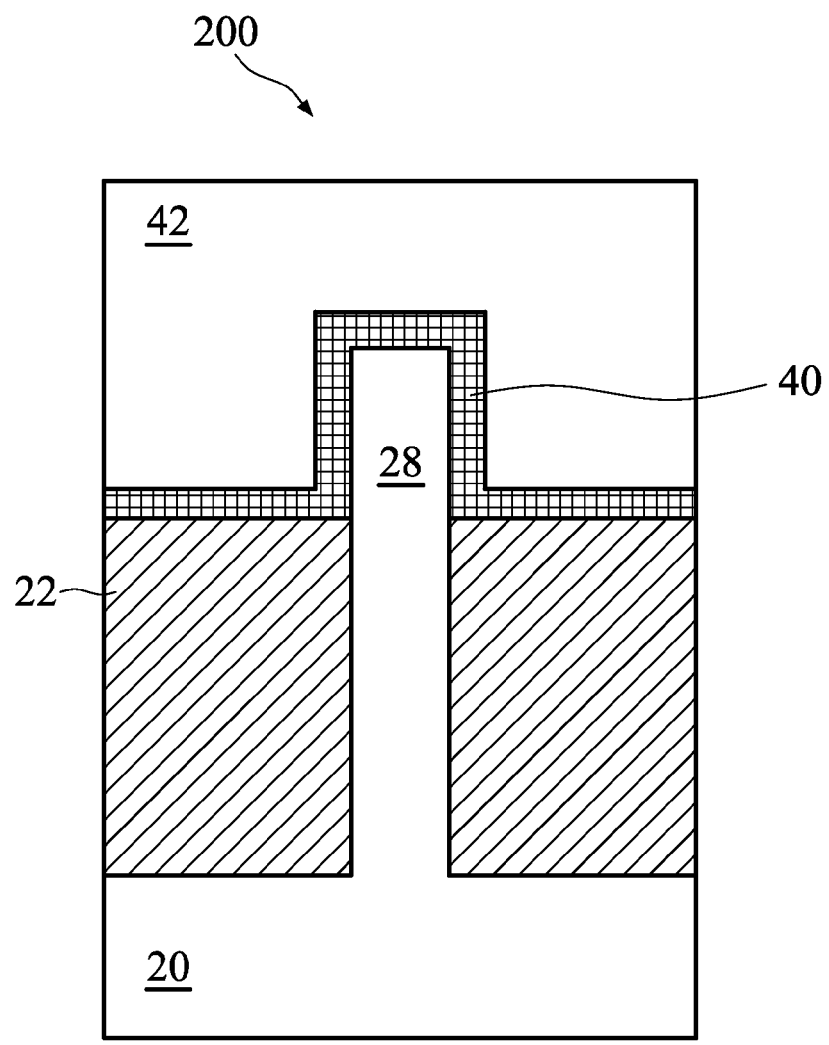
Figure 2D:
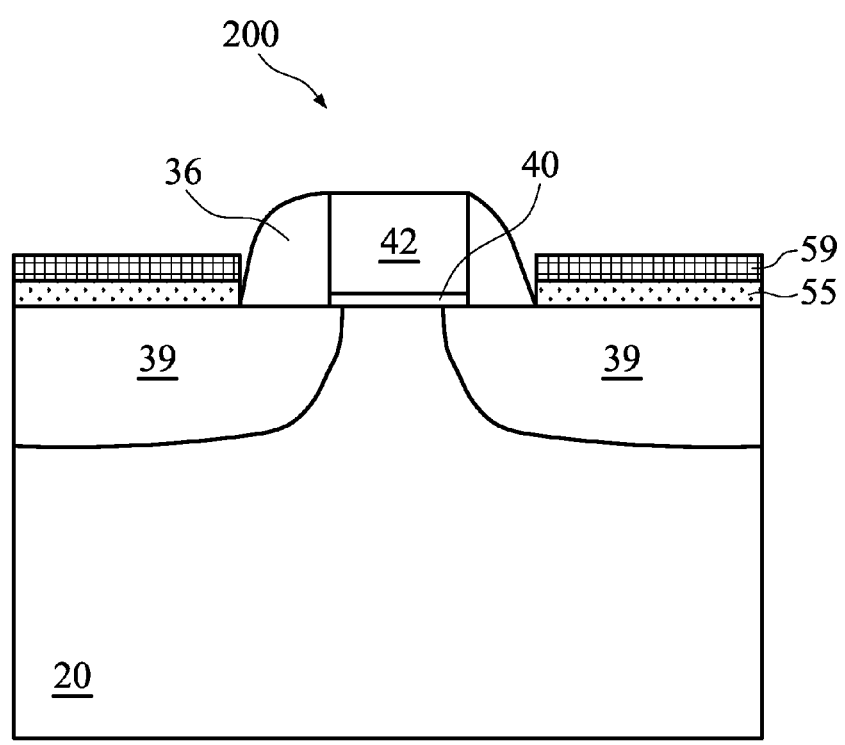

FIG. 2, which includes FIGS. 2a-2d, illustrates a non-planar transistor 200 in accordance with another embodiment of the invention. FIG. 2a illustrates a top view, whereas FIGS. 2b-2d illustrate cross sectional views. This embodiment is similar to the prior embodiment in forming the Schottky contact to reduce contact resistance. However, unlike the prior embodiment, source/drain regions 39 (see e.g., FIG. 2*d*) are formed as in conventional transistors.

The views along FIGS. 2*a* and 2*c* are similar to that shown in FIG. 1*a* and 1*c* respectively, and are not described in detail. FIG. 2*b* illustrates a view taken along the line 2*b*-2*b* of FIG. 2*a*, FIG. 2*c* illustrates a view taken along the line 2*c*-2*c* of FIG. 2*a*, and FIG. 2*d* taken along the line 2*d*-2*d* of FIG. 2*a*. Referring to FIGS. 2*b* and 2*d*, a source/drain regions 39 is disposed within the fins 28. A doped semiconductor layer 55 is disposed over the source/drain regions 39. While a separate raised source/drain region is not illustrated, in various embodiments, the doped semiconductor layer 55 may be formed as or over a raised source/drain region, and disposed over the source/drain regions 39. A metal silicide layer 59 is disposed over the doped semiconductor layer 55 along the top surface and sidewalls of the fin 28. Further, as shown in FIGS. 2*a* and 2*d*, the metal silicide layer 59 does not extend under the gate electrode 42.

The metal silicide layer 59 comprises a suitable metal silicide to lower the Schottky barrier height of the majority carriers. The metal silicide layer 59 is selected as described above in the prior embodiment. Hence, in various embodiments, the metal silicide layer 59 for forming NMOS and PMOS transistors may comprise different metals. The Schottky barrier height between the doped semiconductor layer 55 and the metal silicide layer 59 determines the source/drain series resistance of the transistor. In various embodiments, the doped semiconductor layer 55 is heavily doped so as to minimize this resistance. In an embodiment, the doped semiconductor layer 55 is doped to a concentration greater than about $1 \times 10^{18}$ cm$^{-3}$, and greater than about $5 \times 10^{19}$ cm$^{-3}$ in another embodiment. For example, if a NMOS transistor is being fabricated the doped semiconductor layer 55 comprises an n-type dopant such as arsenic, antimony and/or phosphorus. Alternatively, if a PMOS transistor is being fabricated the doped semiconductor layer 55 comprises a p-type dopant such as boron and/or indium.

Figure 3A:
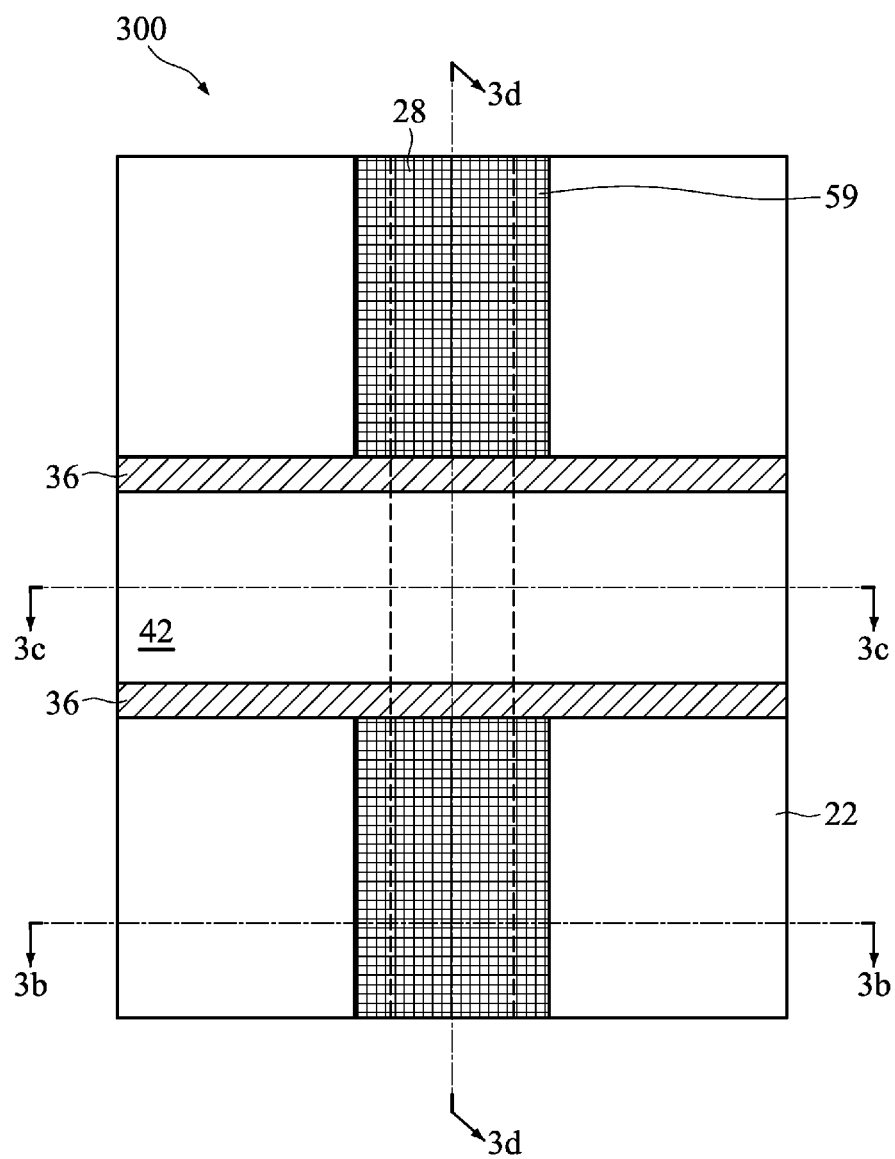
Figure 3B:
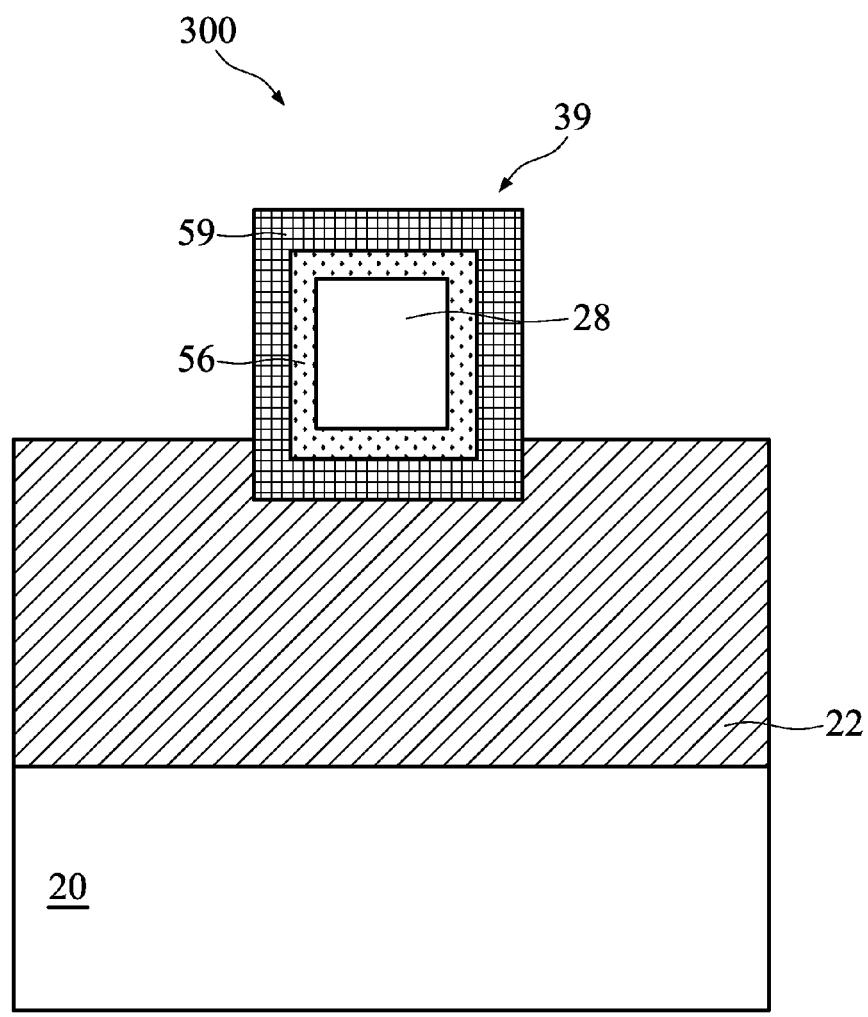
Figure 3C:
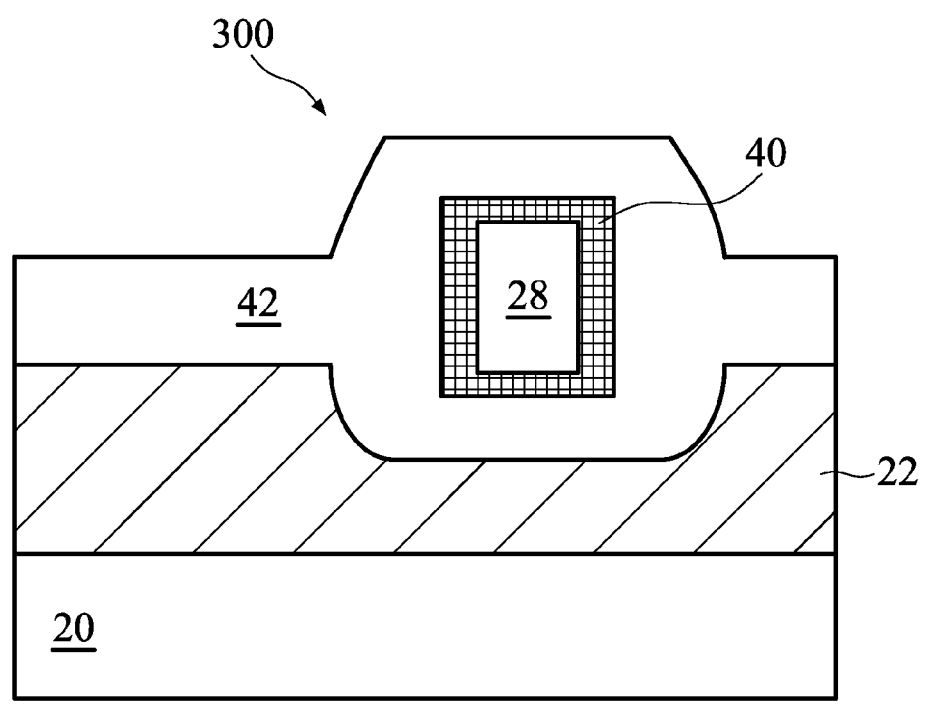
Figure 3D:
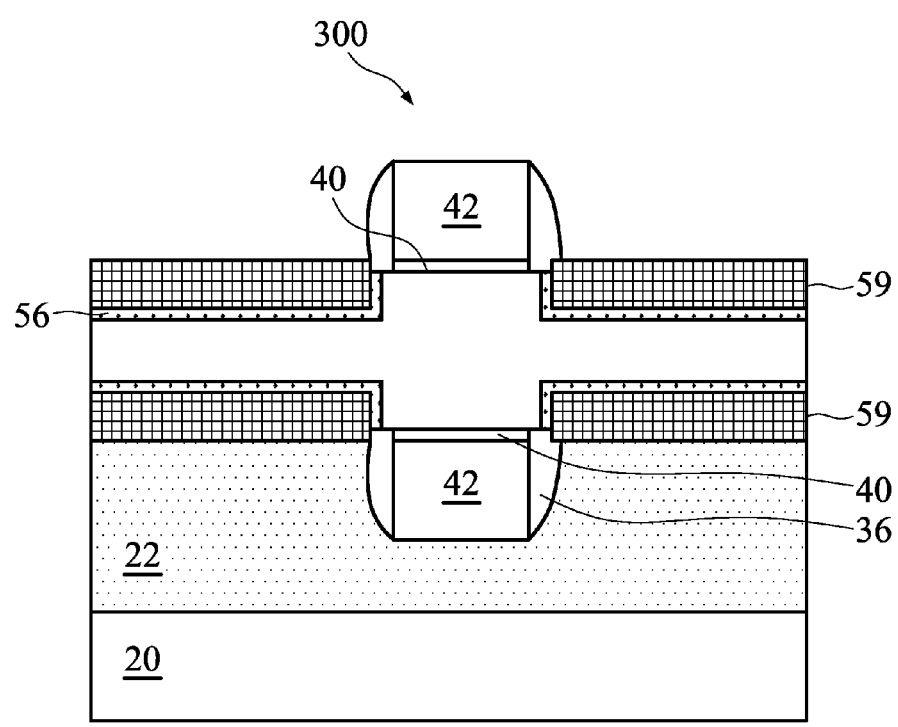

FIG. 3, which includes FIGS. 3*a*-3*d*, illustrates a gate all around transistor 300 in accordance with an embodiment of the invention. FIG. 3*a* illustrates a top view, whereas FIGS. 3*b*-3*d* illustrate cross sectional views.

Referring to FIG. 3*a*, a fin 28 of a transistor 300 is disposed over a substrate 20 (see FIG. 3*b*), and separated by isolation regions 22. The substrate 20 is a semiconductor-on-insulator in an embodiment. A gate electrode 42 is disposed over the fin 28, which is covered with a metal silicide layer 59, which is disposed on either side of the gate electrode 42. Sidewalls of the gate electrode 42 are isolated by spacers 36. A contact (not shown) is disposed on the metal silicide layer 59.

FIG. 3*b* illustrates a cross sectional view of the transistor 300 taken along the line 3*b*-3*b* of FIG. 3*a*. A portion of the fin 28 forming the source/drain region 39 is covered by a dopant rich region 56, and the metal silicide layer 59 is disposed over the dopant rich region 56. In various embodiments, the metal silicide layer 59 is separated from the fin 28 by the dopant rich region 56 of about a constant thickness.

FIG. 3*c* illustrates a cross sectional view of the transistor 300 taken along the line 3*c*-3*c* of FIG. 3*a*. Unlike the prior embodiment, the gate electrode layer 42 surrounds the fin 28 from all directions. As in prior embodiment, a gate dielectric 40 is disposed on the fin 28 and the gate electrode layer 42 is disposed on the gate dielectric 40. Hence, an inversion layer of the channel is formed within the fin 28. As the diameter of the fin 28 is reduced, all the fin 28 under the gate electrode 42 may be inverted (volume inversion). While the fin 28 is illustrated as a cuboid, in various embodiments a cylindrical shape may be used. In an embodiment, the fin 28 may comprise nano-wires. FIG. 3*d* is a cross sectional view of the transistor 300 taken along the line 3*d*-3*d* of FIG. 3*a*. FIG. 3*d* illustrates a cross section of the fin 28 along the current flow direction and illustrates the source/drain regions 39 disposed within the fin 28.

Figure 4C:
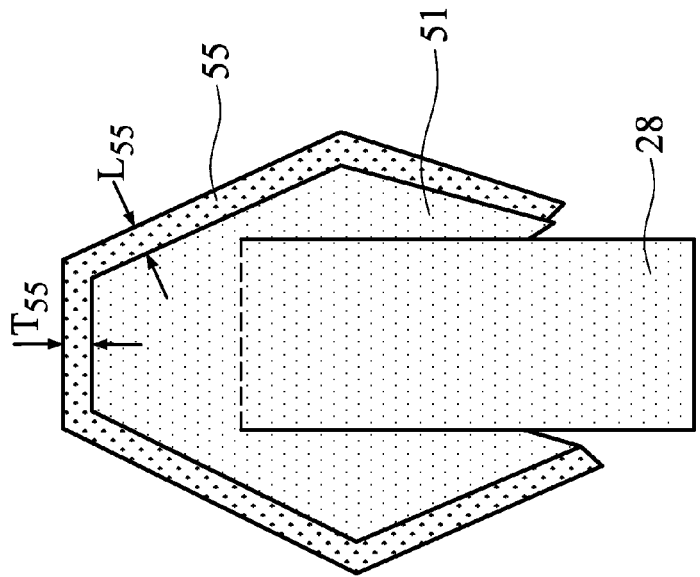

FIG. 4, which includes FIGS. 4*a*-4*e*, illustrate various stages of fabrication of a Schottky contact to a non-planar structure in accordance with embodiments of the invention, wherein FIG. 4*a* illustrates a perspective view of a fin 28, and FIGS. 4*b*-4*e* illustrate cross sectional views of the fin 28 taken along the respective lines shown in FIG. 4*a* during various stages of fabrication.

Figure 4B:
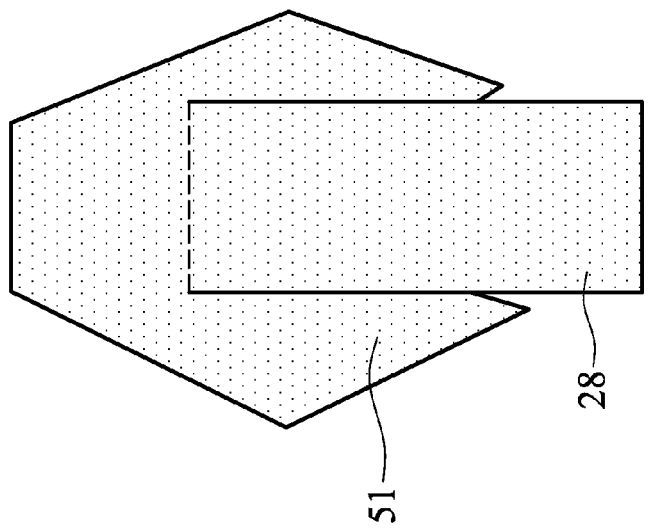

FIG. 4*a* illustrates a fin 28 forming the non-planar structure. Referring to FIG. 4*b*, using a selective epitaxial growth process, a layer of semiconductor material 51 is grown. The growth proceeds in both lateral and vertical directions, for example, at different rates on different crystal planes. In an embodiment, semiconductor material 51 is an intrinsic semiconductor. The semiconductor material 51 may be further doped by implantation and annealing. In various embodiments, the semiconductor material 51 comprises SiGe, SiC, Si or combinations thereof.

Referring to FIG. 4*c*, another selective epitaxial growth is used to form a doped semiconductor layer 55. The process conditions within the epitaxial process are controlled to form a doped semiconductor layer 55 of a uniform thickness. In an embodiment, a doped semiconductor layer 55 comprising a vertical thickness $T_{55}$ and a lateral thickness $L_{55}$ is deposited. In various embodiments, the vertical thickness $T_{55}$ and the lateral thickness $L_{55}$ are about the same. In various embodiments, the vertical thickness $T_{55}$ and the lateral thickness $L_{55}$ are about 5 nm to about 50 nm, and about 15 nm in an embodiment. The doped semiconductor layer 55 may be doped (e.g., in-situ doped) with a p-type dopant if a PMOS transistor is being fabricated. Alternatively, if an NMOS transistor is being fabricated, the doped semiconductor layer 55 is doped with an n-type dopant.

Figure 4E:
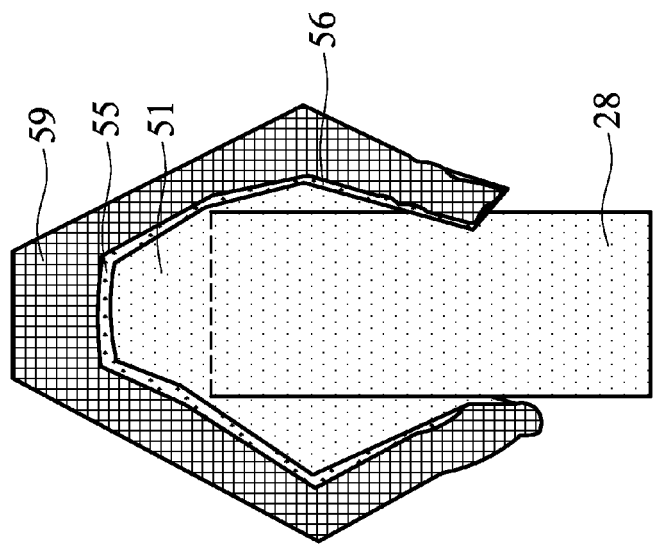
Figure 4D:
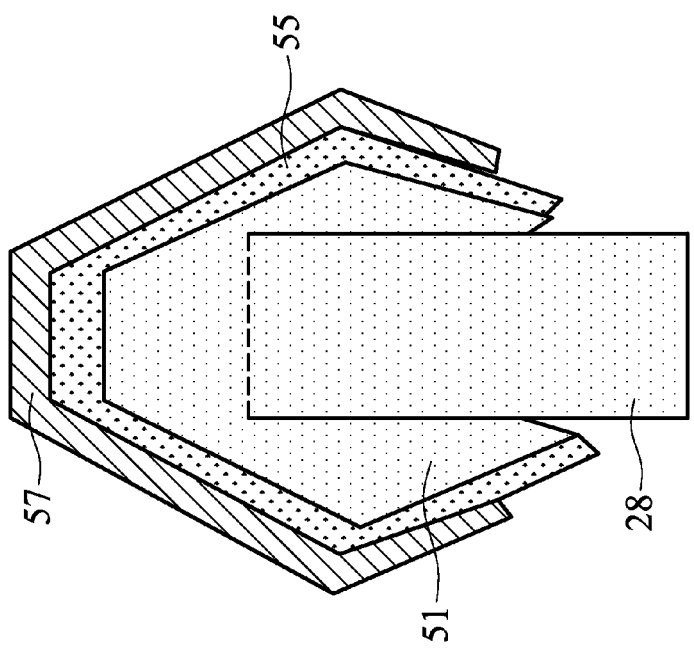

Referring to FIG. 4*d*, a silicide metal 57 is deposited. The silicide metal 57 comprises Ni, Pd, Pt, Pa, Co, Ti, Al, Au, Lanthanoids such as La, Er, and Yb, or combinations thereof. In various embodiments, the silicide metal 57 is about 5 nm to about 50 nm thick. The silicide metal 57 is deposited using a typical process such as sputter deposition. In various embodiments, after forming the doped semiconductor layer 55, the silicide metal 57 is deposited without any intermediate annealing. This avoids diffusion of dopants from the doped semiconductor layer 55.

As next illustrated in FIG. 4*e*, the silicide metal 57 is annealed to form a metal silicide layer 59. Un-reacted silicide metal 57 is removed by an etching process. During the silicidation anneal, the silicide metal 57 (FIG. 4*d*) reacts with the doped semiconductor layer 55 and forms a metal silicide layer 59.

During silicidation, the dopant atoms within the doped semiconductor layer 55 segregate out of and away from the silicide. Hence, the concentration of the dopant atoms on the doped semiconductor layer 55 at the interface between the growing silicide and the doped semiconductor layer 55 increases during silicidation, forming a dopant rich region 56. The concentration of the dopant atoms in the dopant rich region 56 at the interface between the metal silicide layer 59 and the remaining doped semiconductor layer 55 is hence higher than the concentration of the dopant atoms on the as-deposited doped semiconductor layer 55 (shown in FIG. 4*b*).

In alternative embodiments, all of the doped semiconductor layer 55 may be consumed by the silicidation process, leaving only the dopant rich region 56 at the interface between the metal silicide layer 59 and the semiconductor material 51. However, even if the silicide interface moves beyond the doped semiconductor layer 55 and into the semiconductor material 51, the dopant rich region 56 is retained due to the favorable segregation of dopants out of and away from the metal silicide layer 59. Further, the dopant segregation during silicidation follows the contour of the metal silicide layer 59 forming a dopant rich region 56 self-aligned with the metal silicide layer 59. Further, in various embodiments, the doped semiconductor layer 55 is doped in-situ such that no implantation is required for doping the doped semiconductor layer 55, thereby resulting in a defect free silicide interface even with a non-planar structure.

FIGS. 5-8, 9a, 10, and 11a illustrate a non-planar transistor in various stages of fabrication in accordance with embodiments of the invention. FIGS. 9b and 11b illustrate the respective dopant profiles around a silicide region during that stage of processing.

Figure 5:
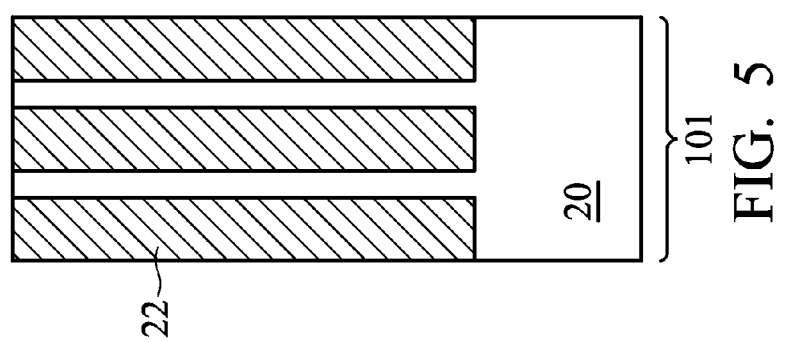

FIG. 5 illustrates a cross-sectional view of a non-planar transistor region 101 of a substrate 20 after forming shallow trench isolation regions 22. The non-planar transistor region 101 may be a core circuit region, for example, comprising the minimum length transistors in an embodiment. In other embodiments, the non-planar transistor region 101 may include a plurality of different types and sizes of transistors.

The substrate 20 comprises bulk silicon in an embodiment. Alternatively, the substrate 20 comprises bulk silicon germanium (SiGe) or other semiconductor materials. In various embodiments, the substrate 20 may comprise an insulator, e.g., a silicon-on-insulator or a germanium-on-insulator. The substrate 20 may be doped with a p-type or an n-type impurity, depending on the types of the resulting transistor.

Referring to FIG. 5, isolation regions 22 are formed on the substrate 20. As is known in the art, the isolation regions 22 may be formed by etching substrate 20 to form recesses, and then filling the recesses with dielectric materials, such as high-density plasma (HDP) oxides, TEOS oxides, or the like. The width of the isolation regions 22 may be less than about 100 nm. One skilled in the art will realize, however, that the dimensions recited throughout the description are merely examples, and will change if different formation technologies and/or technology nodes are used.

FIG. 6, which includes 6a and 6b, illustrates the non-planar transistor region 101 after forming fins.

Figure 6A:
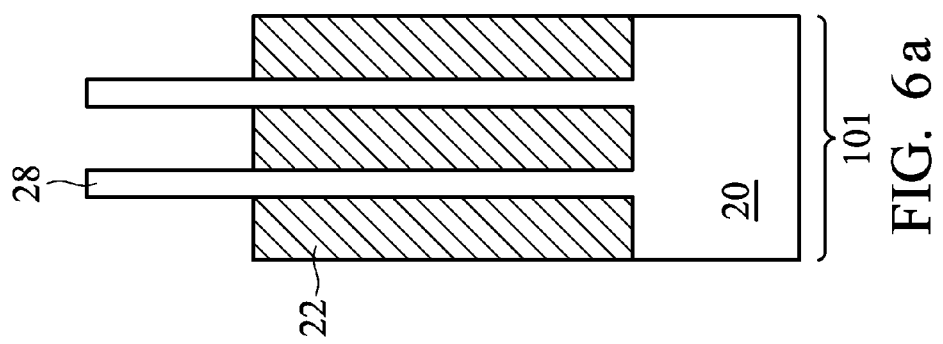
FIGS. 5-8, 9a, 10, 11a, and 11c illustrate a non-planar transistor in various stages of fabrication in accordance with embodiments of the invention.
Figure 6B:
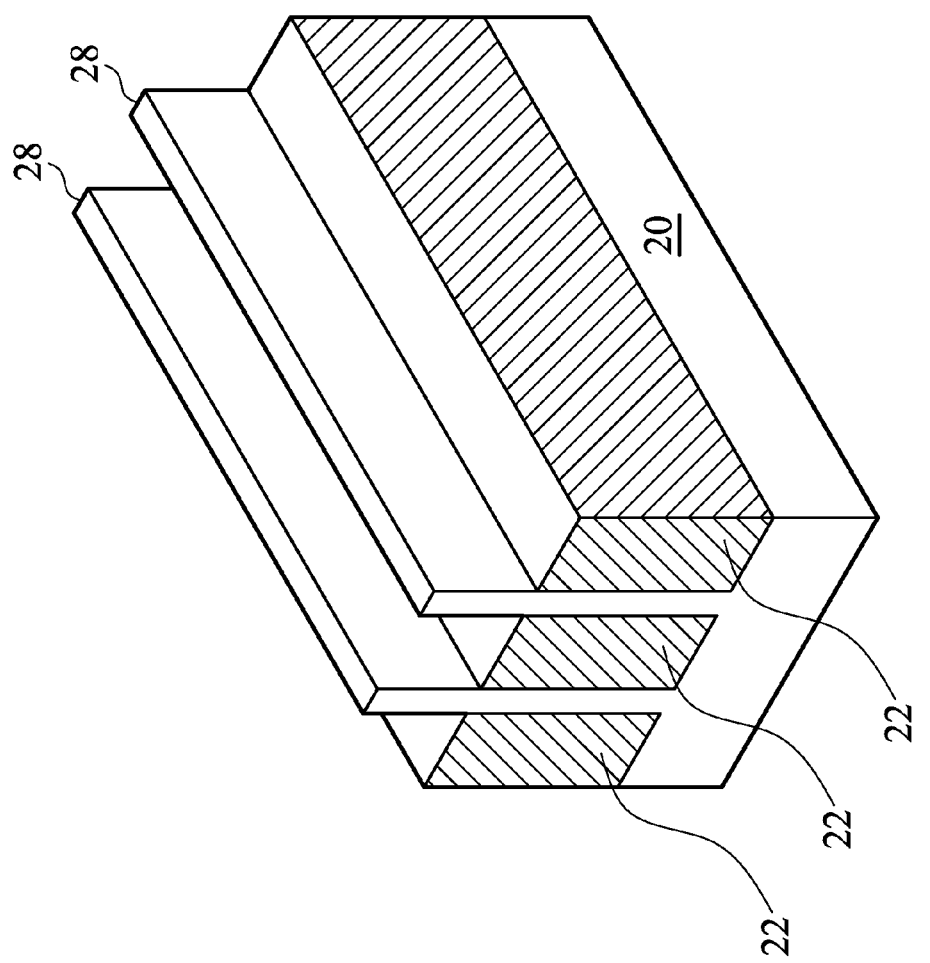

FIG. 6a is a cross-sectional view, while FIG. 6b is a perspective view of the non-planar transistor region shown in FIG. 6a. Fins 28 may be formed by recessing the top surfaces of the isolation regions 22, and hence leaving the fins 28. Alternatively, the fins 28 are epitaxially grown from the semiconductor strips between the isolation regions 22. In an embodiment, a height of the fins 28 above a top surface of the isolation regions 22 is between about 20 nm and about 100 nm, and a ratio of height to width is between about 0.1 and about 10.

The fins 28 are implanted to uniformly dope the channel region of a MOS transistor that is being fabricated, in an embodiment. The channel region of a MOS transistor is doped by a blanket implant, for example, using angled implants at multiple rotations. In an embodiment, if a NMOS transistor is to be formed, the fins 28 are implanted with a p-type dopant such as boron. In an alternative embodiment, if a PMOS transistor is to be formed, the fins 28 are implanted with an n-type dopant such as arsenic.

Figure 7B:
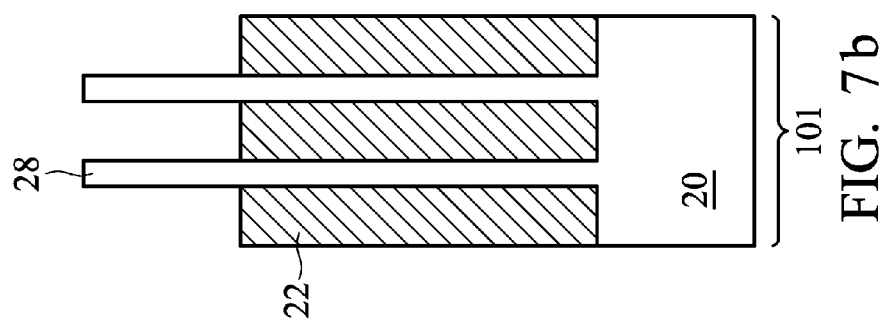
Figure 7A:
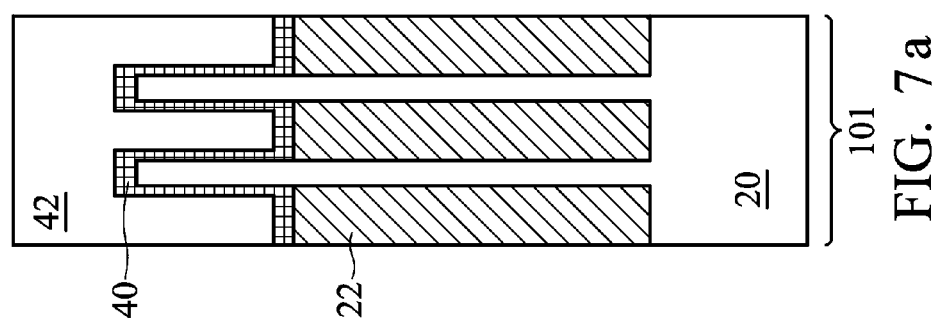
Figure 7C:
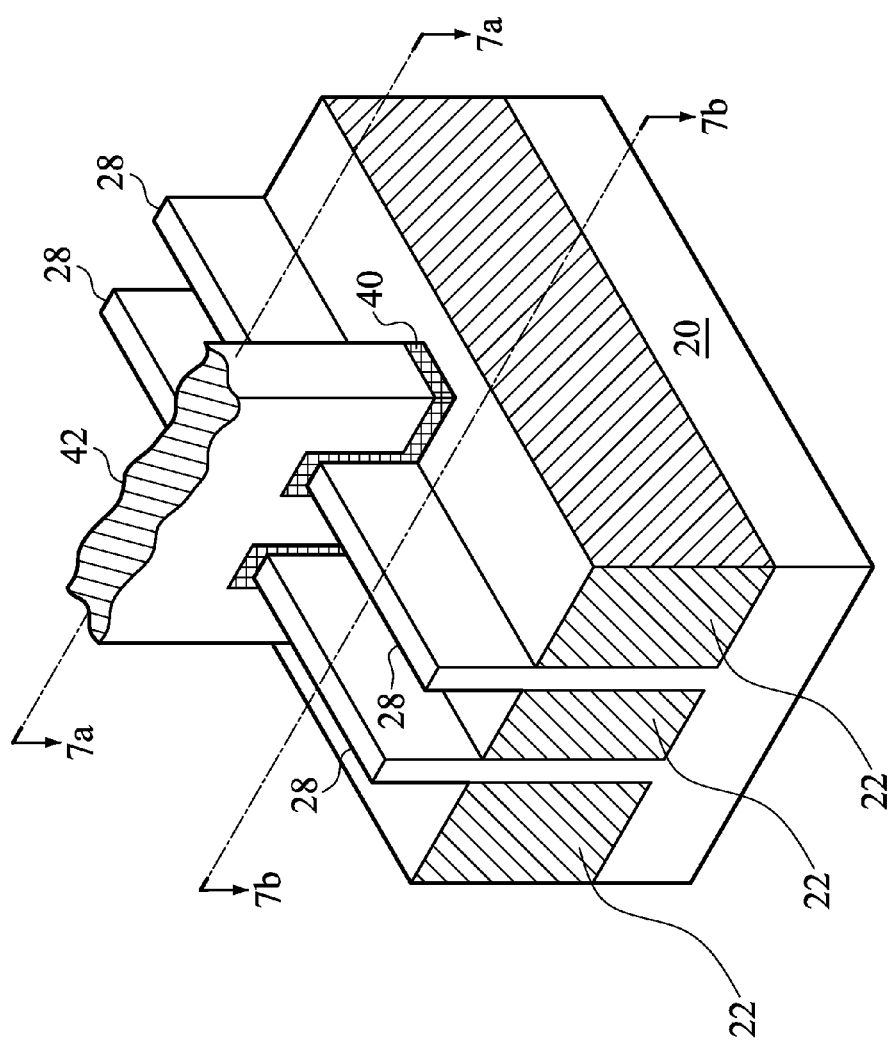

Referring to FIG. 7, a gate dielectric 40 and a gate electrode 42 are deposited and patterned. FIG. 7c illustrates a perspective view of the non-planar transistor region 101, while FIGS. 7a and 7b illustrate cross sectional views taken along the respective lines of FIG. 7c. FIG. 7a illustrates a cross sectional view showing the formation of the gate stack, while FIG. 7b illustrates a cross sectional view of the source/drain region (to be formed) of the non-planar transistor.

The gate dielectric 40 may include commonly used dielectric materials such as oxides, nitrides, oxynitrides, high-K dielectrics such as $Ta_2O_5$, $Al_2O_3$, HfO, $Ta_2O_5$, $SiTiO_3$, HfSiO, HfSiON, ZrSiON, or combinations thereof. The gate electrode layer 42 is formed on the gate dielectric 40, and may be formed of polysilicon in an embodiment.

Alternatively, the gate electrode 42 may be formed of other commonly used conductive materials, including metals such as Ni, Ti, Ta, Hf, or combinations thereof, metal silicides such as NiSi, MoSi, HfSi, or combinations thereof, and metal nitrides such as TiN, TaN, HfN, HfAlN, MoN, NiAlN, or combinations thereof. Next, gate spacers (not shown) are formed on the sidewalls of the gate dielectric 40 and the gate electrode 42, while no gate spacers are formed on the sidewalls of the fins 28.

FIGS. 8-11 illustrate cross sectional views of the source/drain region of the non-planar transistor.

Figure 8:
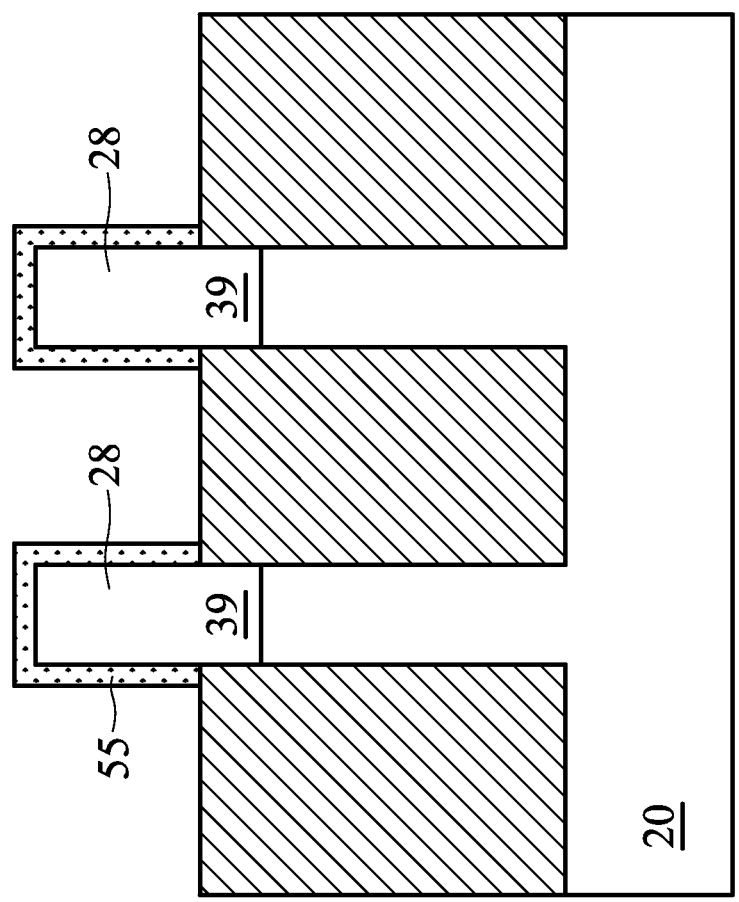

Referring to FIG. 8, after forming source/drain regions 39, and a doped semiconductor layer 55 are formed. Suitable drain extension and source/drain implants are performed into the fin 28 after forming spacers (as required) to form the source/drain regions 39. Subsequently, a selective epitaxial growth is used to form a doped semiconductor layer 55.

The selective epitaxial growth process grows a layer of doped semiconductor material in both a top surface and a lateral surface of the fin 28. Depending on the underlying layer (for example, silicon (100) surface versus silicon (110) versus germanium (100), etc.) and the material being deposited, the doped semiconductor layer 55 may form facets that may merge together or separate out. Preferably the lateral and vertical growth rates and the surface energies of the growing surfaces are controlled such that a continuous layer is formed over the underlying fin 28. A continuous layer will minimize variations between adjacent transistors. In various embodiments, the doped semiconductor layer 55 comprises a doped silicon region, while in some embodiments, the doped semiconductor layer 55 comprises doped SiC, doped SiGe, or doped Ge. In some embodiments, an intrinsic or lightly doped semiconductor layer may be first grown followed by a doped layer during this process.

Figure 9A:
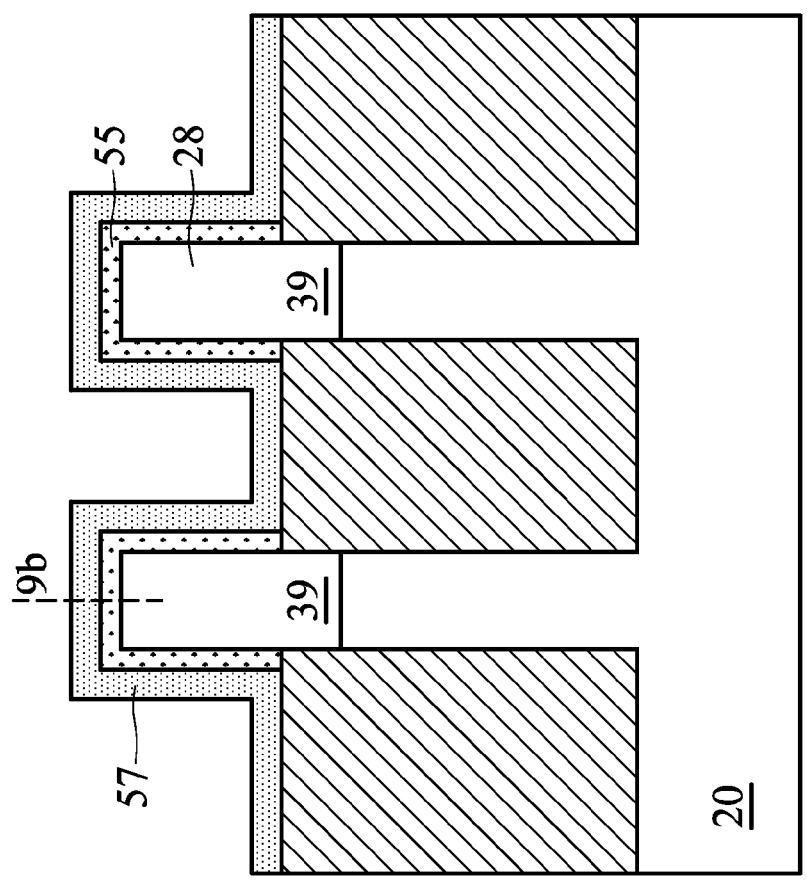
Figure 9B:
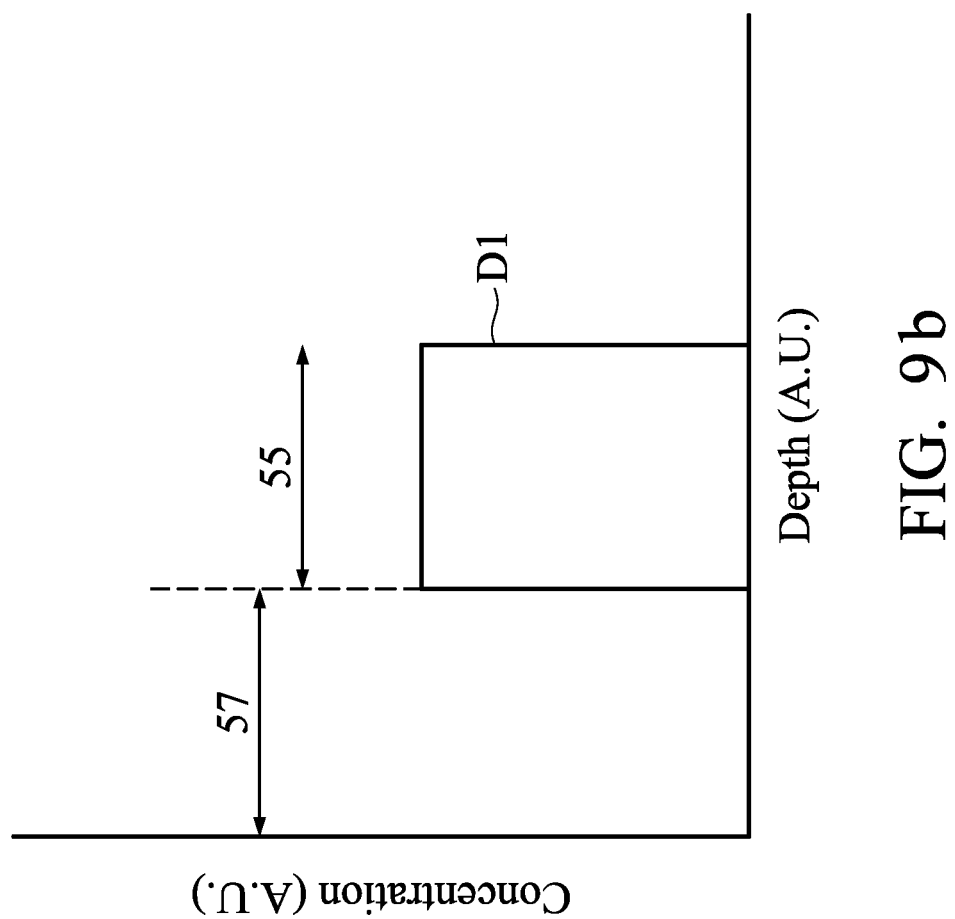
FIGS. 9b and 11b illustrate dopant profiles around a silicide region during the fabrication.

FIG. 9, which includes FIGS. 9a and 9b, illustrates the semiconductor device after depositing a silicide metal 57. The surface of the doped semiconductor layer 55 is cleaned to remove native oxide and other contaminants that might exist prior to depositing the silicide metal 57. The cleaning process can comprise any suitable process, for example, a wet clean or in-situ plasma treatment process.

Referring to FIG. 9a, a silicide metal 57 is deposited over the doped semiconductor layer 55. A one dimensional (1-D) doping profile of the doping is illustrated in FIG. 9b which shows the dopant concentration with reference to the depth. The silicided metal 57 is deposited over the doped semiconductor layer 55. In various embodiments, the silicide metal 57 is deposited using any suitable method, such as sputtering, physical vapor deposition (PVD) techniques, and chemical vapor deposition (CVD) techniques.

The silicide metal 57 comprises a suitable metal, such as, for example, Ni, Co, Ta, Ti, W, Mo, Pd, Yb, Er, NiAl, Pt or an alloy of these metals. In an embodiment, the silicide metal 57 includes Ni or a Ni alloy. In various embodiments, the silicide metal 57 is selected based on the conductivity of the transistor being fabricated. The silicide metal 57 is selected such that a silicide subsequently formed from the silicide metal 57 lowers the Schottky barrier height of the majority carriers. In various embodiments, the silicide metal 57 for a PMOS transistor comprises nickel, platinum, palladium, cobalt, or combinations thereof, and the like. In various embodiments, the silicide metal 57 for a NMOS transistor comprises nickel, aluminum, lanthanoids, or combinations thereof, and the like. In an embodiment, the silicide metal 57 comprises nickel doped with lanthanoids such as La, Er, Y, Yb, Dy, Gd, Ce, Tb, Pr, Er, or combinations thereof. The thickness of silicide metal 57 can be any suitable thickness, such as, for example, a thickness of about 20 nm or less. In an embodiment, the thickness of the silicide metal 57 is about 5 nm to about 10 nm.

Referring to FIG. 9b, the dopant concentration is illustrated after depositing the silicide metal 57 over the fin 28. The as-deposited doping profile D1 of the doped semiconductor layer 55 comprises a uniform doping, although in some embodiments, a graded or a step like concentration may be used.

Figure 10:
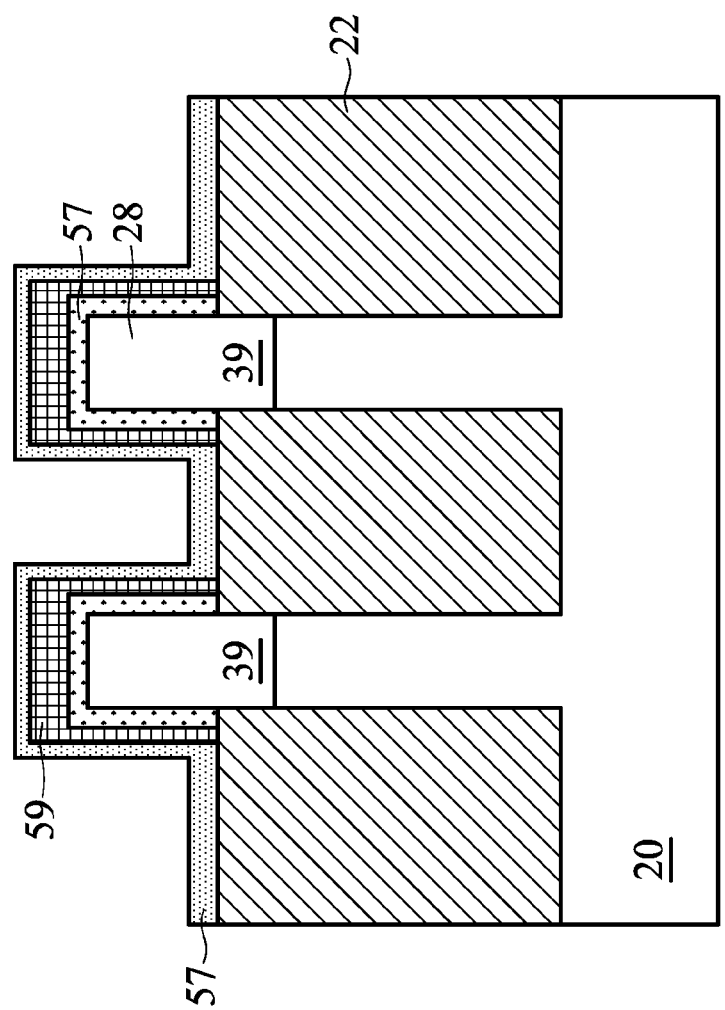

FIG. 10, illustrates the semiconductor device after annealing the silicide metal 57 to form a metal silicide layer 59. During the silicide anneal, atoms from the silicide metal 57 diffuse into the doped semiconductor layer 55, and atoms from the doped semiconductor layer 55 diffuse into the silicide metal 57. The intermixing of the two layers results in the formation of a metal silicide layer 59. During the formation of the metal silicide layer 59, dopant atoms segregate away from the metal silicide layer 59 into the doped semiconductor layer 55 (also referred as "snow-plough" effect). Unlike dopant diffusion that requires a high annealing temperature, interfacial segregation during silicidation occurs at a much lower silicide anneal temperature.

In an embodiment, a first anneal at a first temperature is used to form a metal silicide comprising multiple phases. In an embodiment, the first temperature is about 280° C. to about 700° C. For example, after the first anneal, a plurality of silicides comprising MSi, MSi$_2$, and/or M$_2$Si may be formed. After removing any un-reacted metal silicide 57, a second anneal is subsequently performed to homogenize the metal silicide. For example, after the second anneal a single phase comprising a mono silicide phase (MSi) is formed. Contacts (not shown) are subsequently formed on the metal silicide layer 59 and subsequent processing including metallization proceeds as in conventional processing.

Figure 11A:
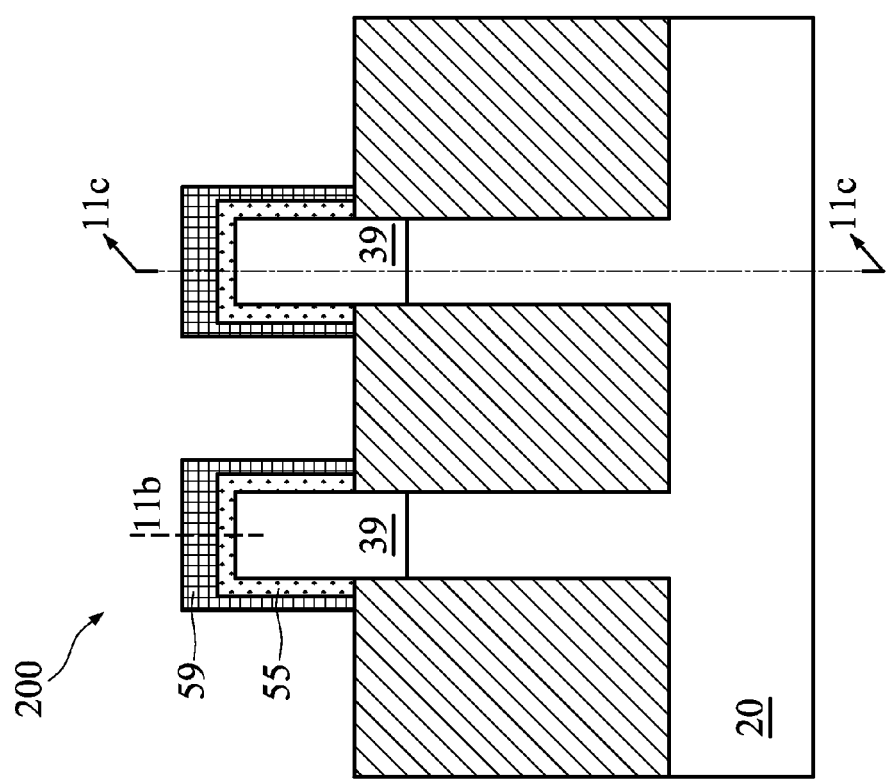
Figure 11B:
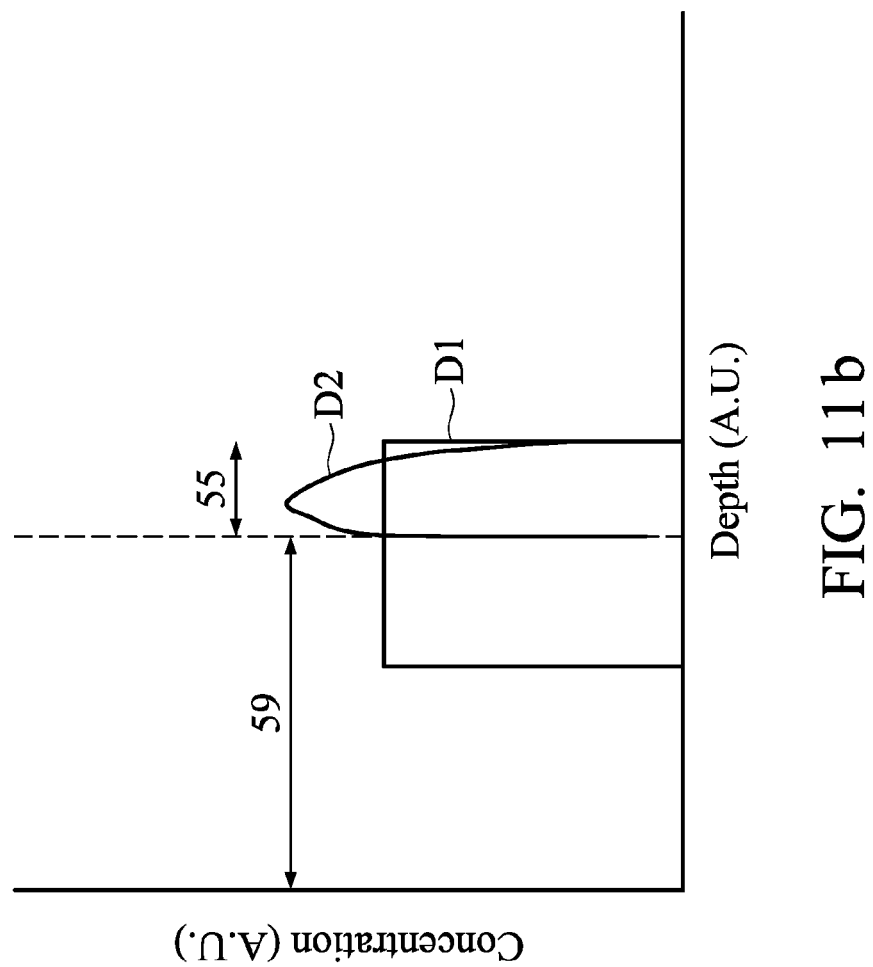
Figure 11C:
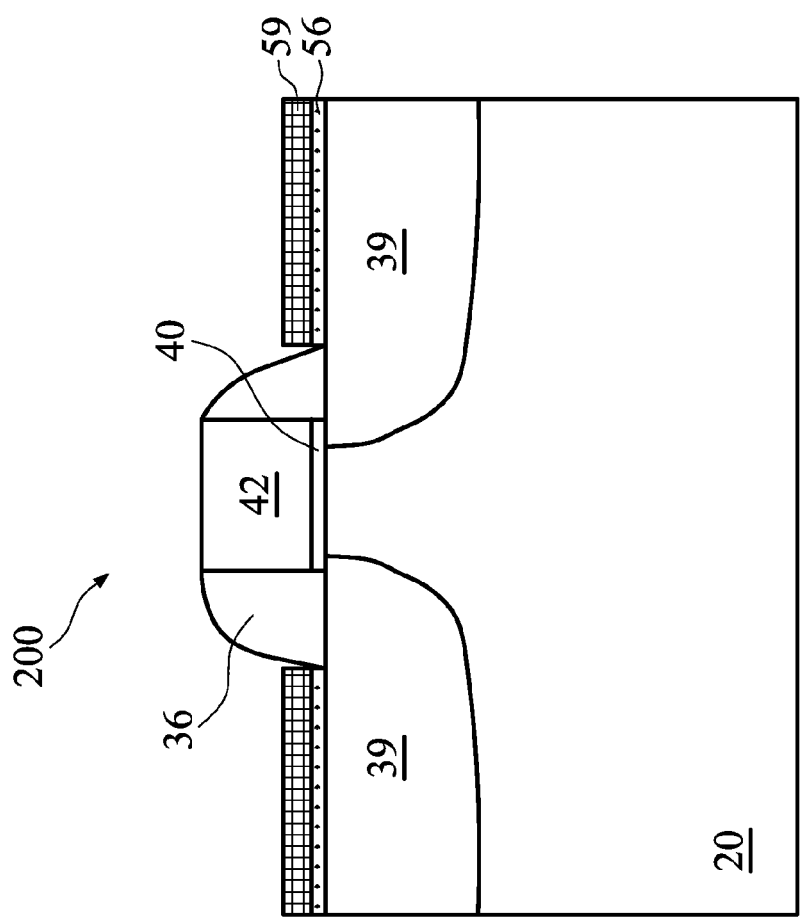

FIG. 11, which includes FIGS. 11a-11c, illustrates the transistor 200 after removing un-reacted silicide metal 57 (see FIG. 10). The un-reacted silicide metal 57 is etched away after the silicide anneal. FIG. 11b compares a concentration of the dopant taken along the line 11b of FIG. 11a before and after the metal silicide anneal. Referring to FIG. 11b, as the dopant preferentially segregates out of the metal silicide layer 59, the dopant concentration increases at the interface between the doped semiconductor layer 55 and the metal silicide layer 59. Hence, the resulting doping profile (D2) in the doped semiconductor layer 55 is higher than a maximum concentration of the as-deposited doping profile (D1). FIG. 11c illustrates a cross sectional view taken along the line 11c of FIG. 11a. Referring to FIG. 11c, the source/drain region 39 are separated by a channel 11, and includes the metal silicide layer 59. The gate electrode 42, the gate dielectric 40, and the spacers 36 are illustrated as described during fabrication in prior Figures.

Figure 12A:
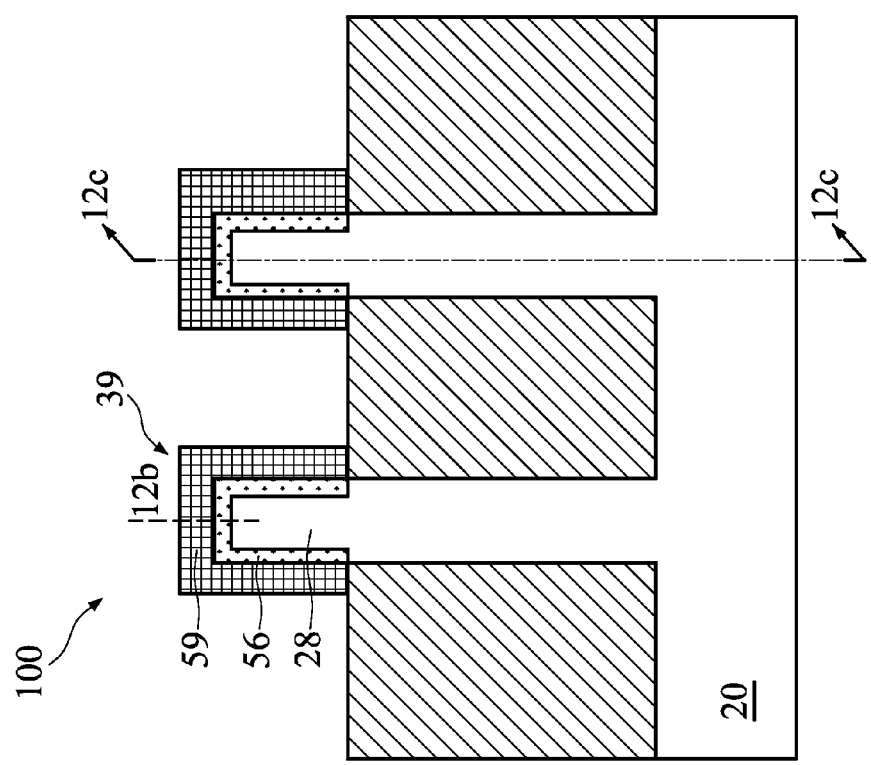
FIGS. 12a and 12c illustrate a non-planar Schottky source/drain transistor during fabrication in accordance with an embodiment of the invention and FIG. 12b illustrates dopant profiles around a silicide region during the fabrication.
Figure 12B:
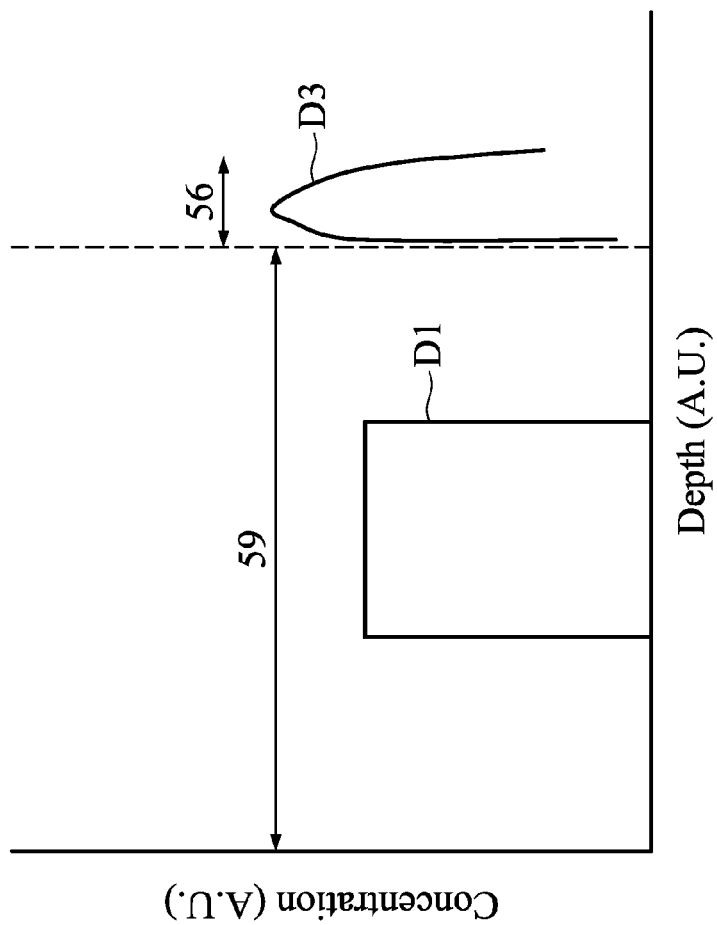
Figure 12C:
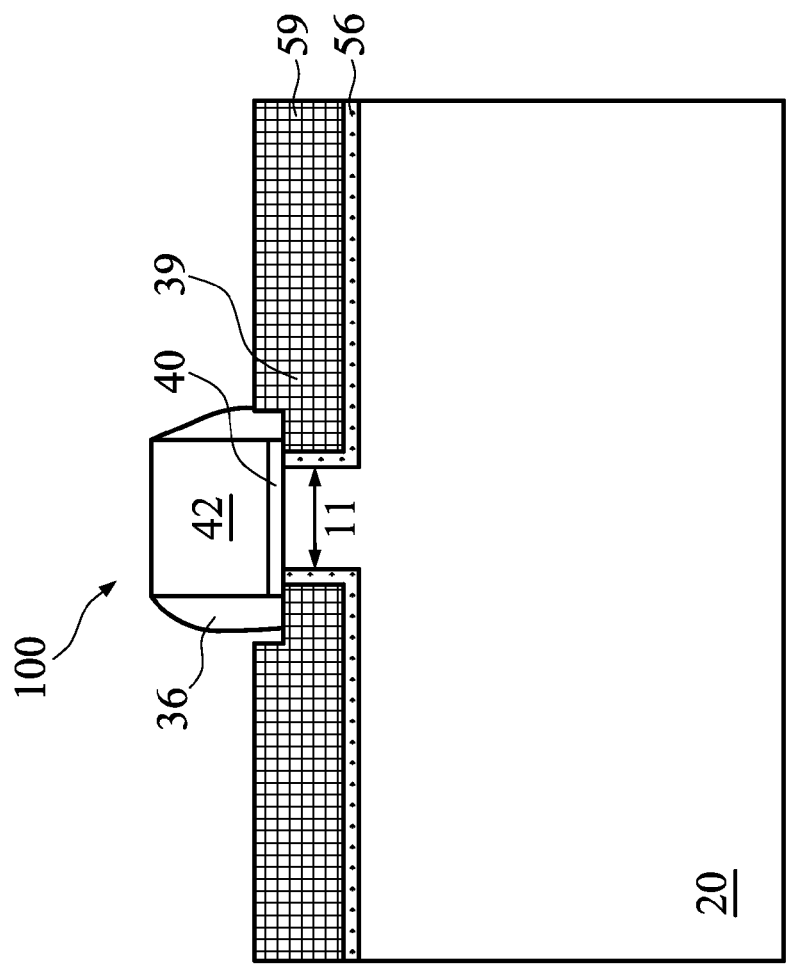

FIG. 12, which includes FIGS. 12a-12c, illustrates an alternative embodiment of the fabrication process described in FIGS. 5-11. As in FIGS. 8-11, the cross sectional view of FIG. 12a corresponds to a transistor 100 taken along the line 7b-7b of FIG. 7c after subsequent processing. FIG. 12b illustrates a 1-D dopant profile after the silicidation process, the cutline taken along the line 12b-12b of FIG. 12a, and FIG. 12c is a cross sectional view taken along the line 12c-12c of FIG. 12a.

Unlike the prior embodiment, in this embodiment, the silicidation process forms the source/drain regions 39 of the transistor 100. Hence, unlike the prior embodiment, the source/drain implants are skipped and the silicidation anneal is prolonged to form a thicker silicide region. Accordingly, the process proceeds as described in FIGS. 5-7 above except for the changes as described herein. As described in FIG. 8, a doped semiconductor layer 55 (see FIG. 8) is formed. However, unlike FIG. 8, no source/drain implantation is performed before forming the doped semiconductor layer 55. Further, unlike the prior embodiment, drain extension implants are also avoided in this embodiment. Hence, high temperature processing required for activating source/drain dopants may be avoided, thus simplifying the manufacturing process. A silicide metal 57 (see FIG. 9) is deposited as described with respect to FIG. 9 forming an as-deposited dopant profile D1 (as shown in FIG. 9b). The thickness of the silicide metal 57 can be any suitable thickness, such as, for example, a thickness of about 100 nm or less. In an embodiment, the thickness of the silicide metal 57 is about 20 nm to about 50 nm.

As in prior embodiment (described in FIG. 10), the silicide metal 57 is annealed to form a metal silicide layer 59. However, unlike the prior embodiment, the silicide anneal time is longer, and the doped semiconductor layer 55 is completely consumed by the silicidation. Further, the silicidation converts a part of the fin 28 into the metal silicide layer 59. Despite, the consumption of the doped semiconductor layer 55, the interface between the metal silicide layer 59 and the fin 28 includes a dopant rich region 56. The formation of the dopant rich region 56 is due to the preferential segregation of the dopant atoms out the metal silicide layer 59 during silicidation (as described in FIG. 9). This results in the formation of a dopant rich region 56 ahead of the moving silicide interface.

As illustrated in FIG. 12b, the dopant concentration increases at the interface between the doped semiconductor layer 55 (see FIG. 11) and the metal silicide layer 59 while the doped semiconductor layer 55 is consumed by the silicidation (as illustrated with reference to FIG. 11b). After the doped semiconductor layer 55 is consumed, the dopant atoms migrate ahead and along with the moving silicide front forming a dynamic doping profile D3 with a high dopant concentration. When the silicidation is stopped, the dynamic doping profile D3 forms a region with high dopant concentration (dopant rich region 56). In various embodiments, the dose of the dopant in the dopant rich region 56 is about the same as the dose of the dopant in the as-deposited doped semiconductor layer 55 (dose of dopant profile D1).

Using this embodiment, a self-aligned silicide source/drain region with low Schottky barrier is formed without any recessing of the fin 28. Optionally, in some embodiments, an additional recess may be formed within the fin 28 before forming the doped semiconductor layer 55 to minimize the silicide thickness. A cross sectional view of the resulting transistor 100 is shown in FIG. 12c, which is a cross section along line 12c-12c of FIG. 12a. The gate electrode 42, the gate dielectric 40, and the spacers 36 are illustrated as described during fabrication in prior Figures (see FIG. 7).

While the embodiments described above in FIGS. 5-12 illustrated the fabrication of a device with two fins 28, in various embodiments, any other suitable combination is possible. Similarly, other types of devices including gate all around devices and vertical transistors may be fabricated using the embodiments described above. In an embodiment for forming a gate all around device, after the formation of the gate electrode 42 around the fin (using a suitable process), a portion of the fin for forming the source/drain regions is exposed. Process steps illustrated in FIGS. 8-11, and/or 12 may be used to form a gate all around transistor, for example, as shown in FIG. 3. In various embodiments, contacts of other types of transistors including bipolar non-planar transistors may be fabricated using the methods described above.

FIG. 13-16 illustrates a non-planar transistor during various stages of manufacturing using embodiments of the invention. The cross sectional views of FIGS. 13-16 correspond to subsequent processing of a transistor 400 in a region as illustrated in the line 7b-7b of FIG. 7c. Unlike the prior embodiment, in this embodiment, a doped semiconductor layer and a metal silicide are formed on a raised source/drain structure.

The processing proceeds as in the prior embodiment as described with respect to FIGS. 5-7 forming a gate dielectric and a gate electrode (as shown in FIG. 7). Next, gate spacers (not shown) are formed on the sidewalls of the gate dielectric and the gate electrode, while no gate spacers are formed on the sidewalls of the fins 28. An extension implant may optionally be performed to dope the exposed portions of the fins 28. The extension implant is a large angled low energy implant in an embodiment. The extension implant dopes the exposed portions of the fins 28 with an n-type doping if a NMOS transistor is being formed, or a p-type doping if a PMOS transistor is being formed. An angled or tilted halo implant may be optionally performed as a sequence of multiple rotations. For example, a counter doping implant at an implant angle greater than 45° with respect to the vertical axis and in rotations of 45°, 135°, 225°, and 315° with respect to the gate electrode may be performed in an embodiment. Additional spacers may be formed after the extension implants.

Figure 13:
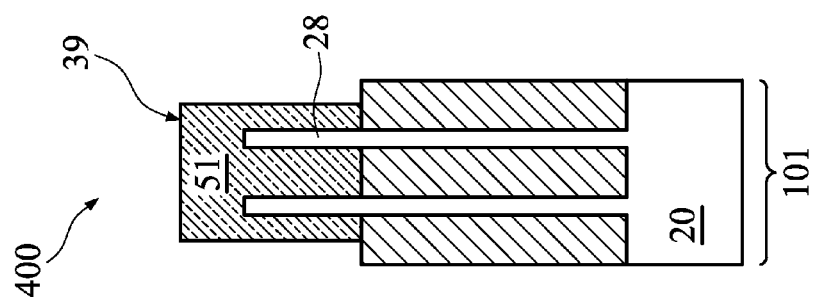
FIGS. 13-16 illustrate a non-planar transistor in various stages of fabrication in accordance with an embodiment of the invention.

Referring to FIG. 13, a selective epitaxial growth is performed to form semiconductor material 51. The semiconductor material 51 forms the source/drain regions 39 (raised source/drain) of the non-planar transistor 400. In an embodiment, the semiconductor material 51 is formed of the same material as the substrate 20, and is epitaxially grown on the fins 28. In alternative embodiments, semiconductor material 51 is formed of a material different from that of substrate 20, for example, silicon germanium (SiGe), silicon carbon (SiC), etc. Being a selective epitaxial deposition process, the semiconductor material 51 does not grow on the gate dielectric and the gate electrode (gate electrode and gate dielectric illustrated in FIG. 7).

The epitaxial growth includes vertical growth and horizontal growth. Hence, if the transistor being formed comprises multiple fins (fingered transistors), the portion of semiconductor material 51 grown from one of the fins 28 eventually joins the portion of semiconductor material 51 grown from a neighboring fin 28. As shown in FIG. 13, the epitaxially grown semiconductor material 51 forms a continuous region. Alternatively, the separation between adjacent fins 28 may be large such that the semiconductor material 51 does not form a continuous layer. Rather, in such embodiments, each fin 28 forms a separate raised source/drain region comprising the semiconductor material 51.

During the growth of semiconductor material 51, a p-type impurity or an n-type impurity may be in-situ doped, and hence the resulting semiconductor material 51 may be of p-type or n-type. The impurity concentration of the semiconductor material 51 may be between about $1 \times 10^{17}/cm^3$ to about $5 \times 10^{20}/cm^3$.

While the semiconductor material 51 may be pre-doped in some embodiments, the semiconductor material 51 may be further doped by implantation. In various embodiments, the implants may be angled and may comprise multiple rotations. In an embodiment, if a PMOS transistor is to be formed in the non-planar transistor region 101, the corresponding NMOS transistor regions are masked, and a p-type impurity is implanted into the PMOS transistor region. Alternatively, if a NMOS transistor is to be formed in the non-planar transistor region 101, the corresponding PMOS transistor regions are masked, and an n-type impurity is implanted into the NMOS transistor region. A spike anneal or a micro second anneal may be used to activate the implanted dopants, thus forming source/drain regions 39.

Figure 14:
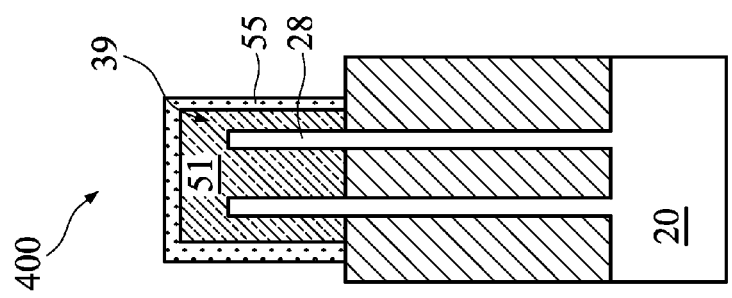

Referring to FIG. 14, after forming suitable spacers, a selective epitaxial growth is used to form a doped semiconductor layer 55. In some embodiments, if no source/drain implantation is required, a single epitaxial process may be used to deposit the semiconductor material 51 and the doped semiconductor layer 55. The selective epitaxial growth process grows a layer of doped semiconductor material in both a top surface and a lateral surface of the source/drain regions 39. Depending on the underlying layer (for example, semiconductor material 51) and the material being deposited, the doped semiconductor layer 55 may grow forming facets that may merge together or separate out. The different surface being on different crystal planes may have different growth rates. The lateral and vertical growth rates and the surface energies of the growing surfaces are controlled such that a continuous layer is formed over the underlying semiconductor material 51. A continuous layer will minimize variations in sheet resistance in the subsequently formed silicide layer. In various embodiments, the doped semiconductor layer 55 comprises a doped silicon region, while in some embodiments, the doped semiconductor layer 55 comprises doped SiC, doped SiGe, or doped Ge.

Figure 15:
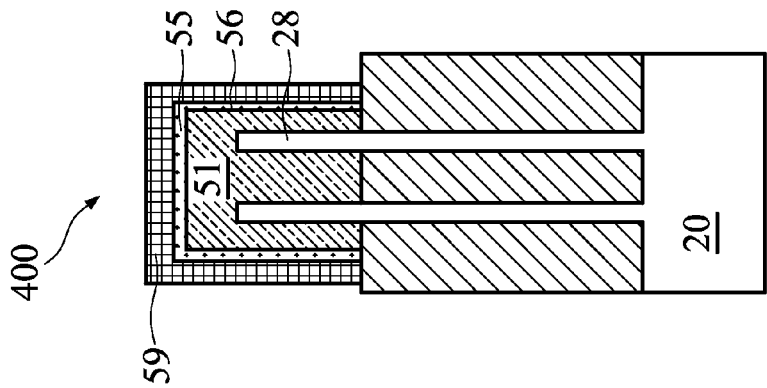

FIG. 15 illustrates the semiconductor device after depositing a silicide metal 57. The surface of the doped semiconductor layer 55 is cleaned to remove native oxide and other contaminants that might exist prior to depositing the silicide metal 57. The cleaning process can comprise any suitable process, for example, a wet clean or in-situ plasma treatment process. As in the prior embodiment, a silicide metal 57 is deposited over the doped semiconductor layer 55. In various embodiments, the silicide metal 57 is deposited using any suitable method, such as sputtering, physical vapor deposition (PVD) techniques, and chemical vapor deposition (CVD) techniques.

The silicide metal 57 comprises a suitable metal, such as, for example, Ni, Co, Ta, Ti, W, Mo, Pd, NiAl, Pt, Lanthanoids, or an alloy of these metals. In various embodiments, the silicide metal 57 for a PMOS transistor comprises nickel, platinum, palladium, cobalt, or combinations thereof, and the like. In various embodiments, the silicide metal 57 for a NMOS transistor comprises nickel, aluminum, lanthanoids, or combinations thereof, and the like. In an embodiment, the silicide metal 57 comprises nickel doped with lanthanoids such as La, Er, Y, Yb, Dy, Gd, Ce, Tb, Pr and/or Er. The thickness of silicide metal 57 can be any suitable thickness, such as, for example, a thickness of about 20 nm or less. In an embodiment, the thickness ranges from about 5 nm to about 10 nm.

Figure 16:
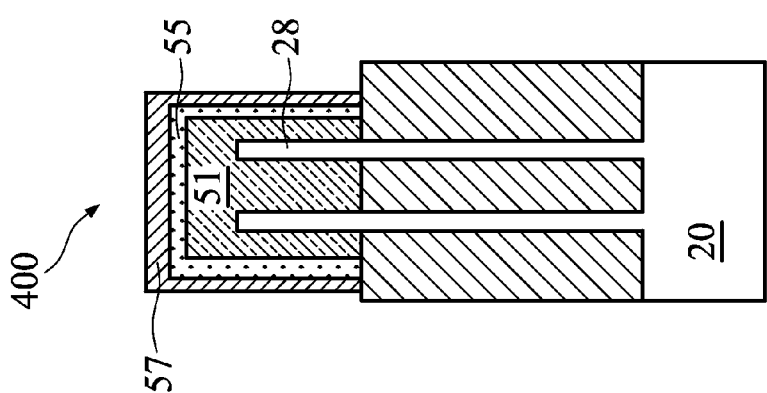

FIG. 16 illustrates the semiconductor device after annealing the silicide metal to form the metal silicide layer 59. Any un-reacted silicide metal 57 is etched and removed after the silicide anneal. FIG. 16 also illustrates the dopant rich region 56 formed within the remaining doped semiconductor layer 55. In various embodiments, all of the doped semiconductor layer 55 may be consumed by the silicidation, leaving only the dopant rich region 56. Subsequent processing including metallization proceeds as in conventional processing.

While the embodiment described above in FIGS. 13-16 illustrated the fabrication of a device with at least two fins 28, in various embodiments, any other suitable combination is possible. For example, if the method described in FIG. 13-16 is used in fabrication of a device with a single fin, the device corresponding to the embodiment described in FIG. 2 may be formed. Similarly, other types of devices including gate all around devices and vertical transistors may be fabricated using the embodiments described above. In various embodiments, contacts of other types of transistors including bipolar non-planar transistors may be fabricated using the methods described above.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a non-planar transistor, the method comprising:
   forming a channel region on a first portion of a semiconductor fin, the semiconductor fin comprising a top surface and sidewalls;
   forming a gate electrode over the channel region of the semiconductor fin;
   forming a semiconductor layer on the top surface and the sidewalls of the semiconductor fin on opposing sides of the gate electrode using a selective epitaxial growth process and having a first doping concentration;
   growing an in-situ doped semiconductor layer over the semiconductor layer and on the top surface and the sidewalls of the semiconductor fin on opposing sides of the gate electrode using a selective epitaxial growth process and having a second doping concentration greater than the first doping concentration; and
   converting at least a part of the doped semiconductor layer to form a dopant rich region.

2. The method of claim 1, wherein the doped semiconductor layer comprises a first concentration of a dopant after the selective epitaxial growth process, and wherein after the conversion a peak concentration of the dopant in the dopant rich region is higher than the first concentration.

3. The method of claim 1, wherein the dopant rich region is aligned to a silicide layer, and wherein all of the doped semiconductor layer is converted into the silicide layer.

4. The method of claim 3, wherein the semiconductor layer is disposed between the fin and the silicide layer after all of the doped semiconductor layer is converted into the silicide layer.

5. The method of claim 1, wherein at least a portion of the dopant rich region is disposed under the gate electrode.

6. The method of claim 1, wherein converting at least a part of the doped semiconductor layer comprises:
   depositing a silicide metal layer on the doped semiconductor layer; and
   forming a dopant rich region adjacent a silicide layer by converting at least a part of the silicide metal layer and at least a part of the doped semiconductor layer into the silicide layer.

7. The method of claim 6, wherein the silicide layer forms a source/drain region of the non-planar transistor, and wherein an interface between the silicide layer and the dopant rich region forms a Schottky barrier.

8. The method of claim 6, further comprising forming a source/drain region before growing a doped semiconductor layer.

9. The method of claim 6, wherein the silicide layer comprises a metal selected from the group consisting of Ni, Al, La, Er, Y, Yb, Dy, Gd, Ce, Tb, Pr, Er, Co, Pd, Pt and combinations thereof, and wherein the non-planar transistor comprises a double gate, a triple gate, or a gate all around transistor.

10. The method of claim 1, further comprising doping the semiconductor layer with a dopant and annealing the semiconductor layer prior to the growing an in-situ doped semiconductor layer.

11. A method of forming a non-planar transistor, the method comprising:
   forming a channel region on a first portion of a semiconductor fin, the semiconductor fin comprising a top surface and sidewalls;
   forming a gate electrode over the channel region of the semiconductor fin;
   growing a semiconductor layer having a first doping profile on the top surface and the sidewalls of a remaining portion of the semiconductor fin using a selective epitaxial growth process;
   growing an in-situ doped semiconductor layer having a second doping profile over the semiconductor layer and on the top surface and the sidewalls of a remaining portion of the semiconductor fin using a selective epitaxial growth process, the first doping profile different than the second doping profile;
   depositing a metal layer on the doped semiconductor layer; and
   after depositing the metal layer, forming a dopant rich layer of a uniform thickness and a silicide layer over the dopant rich layer.

12. The method of claim 11, wherein the dopant rich layer is aligned to the silicide layer, wherein forming the dopant rich layer comprises converting at least a part of the metal layer and at least a part of the doped semiconductor layer into the silicide layer.

13. The method of claim 12, wherein the semiconductor layer is disposed between the fin and the silicide layer after at least a part of the doped semiconductor layer is converted into the silicide layer.

14. The method of claim 11, wherein all of the doped semiconductor layer is converted into the silicide layer and wherein the semiconductor layer is disposed between the fin and the silicide layer after the doped semiconductor layer is converted to the silicide layer.

15. The method of claim 11, wherein the silicide layer forms a source/drain region of the non-planar transistor, and wherein an interface between the silicide layer and the dopant rich layer forms a Schottky barrier.

16. The method of claim 11, wherein the silicide layer comprises a metal selected from the group consisting of Ni, Co, Pd, Pt and combinations thereof, and wherein the non-planar transistor comprises a PMOS transistor.

17. The method of claim 11, wherein the silicide layer comprises a metal selected from the group consisting of Ni, Al, La, Er, Y, Yb, Dy, Gd, Ce, Tb, Pr, Er, $NiSi_2Al_x$ and combinations thereof, and wherein the non-planar transistor comprises a NMOS transistor.

18. The method of claim 11, wherein at least a portion of the dopant rich layer is disposed under the gate electrode.

19. The method of claim 11, further comprising doping the semiconductor layer with a dopant prior to the growing an in-situ doped semiconductor layer.

20. The method of claim 19, further comprising annealing the semiconductor layer after the doping the semiconductor layer and prior to the growing an in-situ doped semiconductor layer.

* * * * *